US011475959B1

(12) United States Patent
Lien et al.

(10) Patent No.: US 11,475,959 B1
(45) Date of Patent: Oct. 18, 2022

(54) REDUCED PROGRAM TIME FOR MEMORY CELLS USING NEGATIVE BIT LINE VOLTAGE FOR ENHANCED STEP UP OF PROGRAM BIAS

(71) Applicant: SanDisk Technologies LLC, Addison, TX (US)

(72) Inventors: Yu-Chung Lien, San Jose, CA (US); Sujjatul Islam, San Jose, CA (US); Xue Pitner, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/363,419

(22) Filed: Jun. 30, 2021

(51) Int. Cl.
*G11C 16/04* (2006.01)
*G11C 16/10* (2006.01)
*G11C 16/34* (2006.01)
*G11C 16/24* (2006.01)
*G11C 11/56* (2006.01)
*H01L 27/11556* (2017.01)
*H01L 27/11582* (2017.01)
*G11C 16/08* (2006.01)

(52) U.S. Cl.
CPC .......... *G11C 16/10* (2013.01); *G11C 16/0483* (2013.01); *G11C 16/24* (2013.01); *G11C 16/3459* (2013.01); *G11C 11/5628* (2013.01); *G11C 11/5671* (2013.01); *G11C 16/08* (2013.01); *H01L 27/11556* (2013.01); *H01L 27/11582* (2013.01)

(58) Field of Classification Search
CPC ..... G11C 16/10; G11C 16/0483; G11C 16/24; G11C 16/3459; G11C 11/5628; G11C 11/5671; G11C 16/08; H01L 27/11556; H01L 27/11582

USPC ...................................................... 365/185.17
See application file for complete search history.

(56) References Cited

U.S. PATENT DOCUMENTS

| 8,274,838 B2 | 9/2012 | Dutta et al. | |
| 2009/0323429 A1* | 12/2009 | Lee ..................... | G11C 11/5628 365/185.18 |
| 2011/0122692 A1* | 5/2011 | Dutta .................. | G11C 11/5628 365/185.03 |

(Continued)

OTHER PUBLICATIONS

U.S. Appl. No. 17/191,315, filed Mar. 3, 2021.

(Continued)

*Primary Examiner* — Tha-O H Bui
(74) *Attorney, Agent, or Firm* — Vierra Magen Marcus LLP

(57) ABSTRACT

Apparatuses and techniques are described for reducing the program time for a set of memory cells by using an enhanced step up of a program bias. A program operation includes a first pass in which memory cells are programmed to intermediate states and a second program pass in which the memory cells are programmed from an erased state and the intermediate states to final states. In the first program pass, program time can be reduced by applying an enhanced program bias step up to memory cells of the highest intermediate state in a single program loop, for example. The enhanced program bias step up can be achieved by applying a negative bit line voltage and can be triggered when the memory cells assigned to the second highest intermediate state reach a program milestone such as completing programming.

20 Claims, 21 Drawing Sheets

(56) References Cited

U.S. PATENT DOCUMENTS

2011/0292724 A1* 12/2011 Kim .................. G11C 16/3459
365/185.03
2021/0134370 A1  5/2021 Zhang et al.

OTHER PUBLICATIONS

U.S. Appl. No. 17/188,998, filed Mar. 1, 2021.
U.S. Appl. No. 17/192,598, filed Mar. 4, 2021.
U.S. Appl. No. 17/142,753, filed Jan. 6, 2021.

* cited by examiner

Fig. 9A
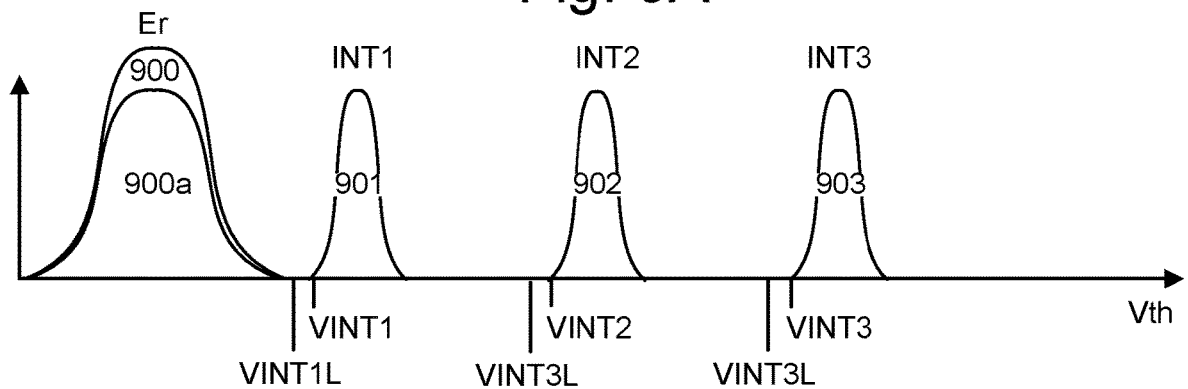
Fig. 9B
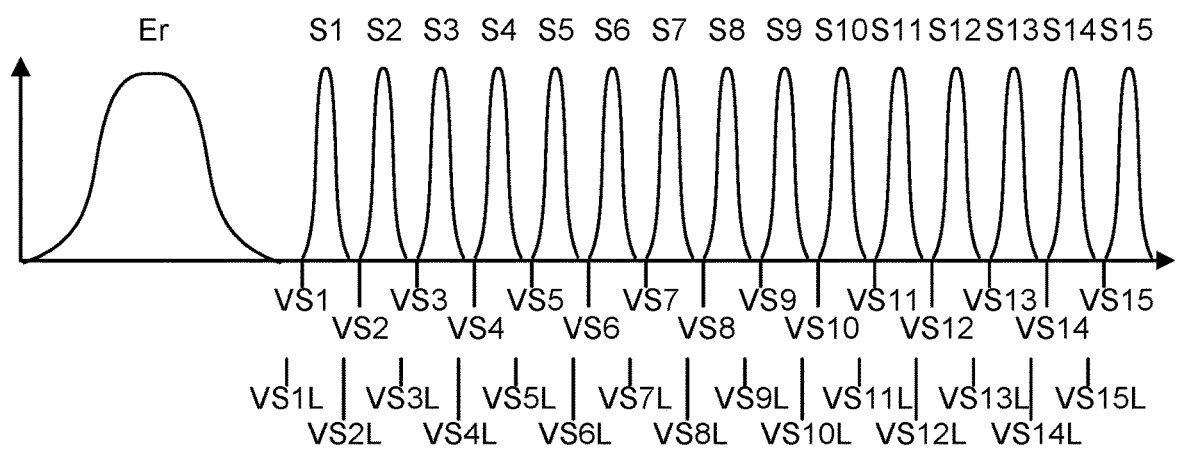
Fig. 9C
| Page | Er/S0 | S1 | S2 | S3 | S4 | S5 | S6 | S7 | S8 | S9 | S10 | S11 | S12 | S13 | S14 | S15 |
|------|-------|----|----|----|----|----|----|----|----|----|----|----|----|----|----|----|
| TP | 1 | 0 | 0 | 1 | 1 | 1 | 1 | 0 | 0 | 0 | 0 | 1 | 1 | 1 | 0 | 0 |
| UP | 1 | 1 | 0 | 0 | 0 | 1 | 1 | 1 | 1 | 0 | 0 | 0 | 0 | 1 | 1 | 0 |
| MP | 1 | 1 | 1 | 1 | 0 | 0 | 0 | 0 | 0 | 0 | 0 | 0 | 1 | 1 | 1 | 1 |
| LP | 1 | 1 | 1 | 1 | 1 | 1 | 0 | 0 | 1 | 1 | 0 | 0 | 0 | 0 | 0 | 0 |

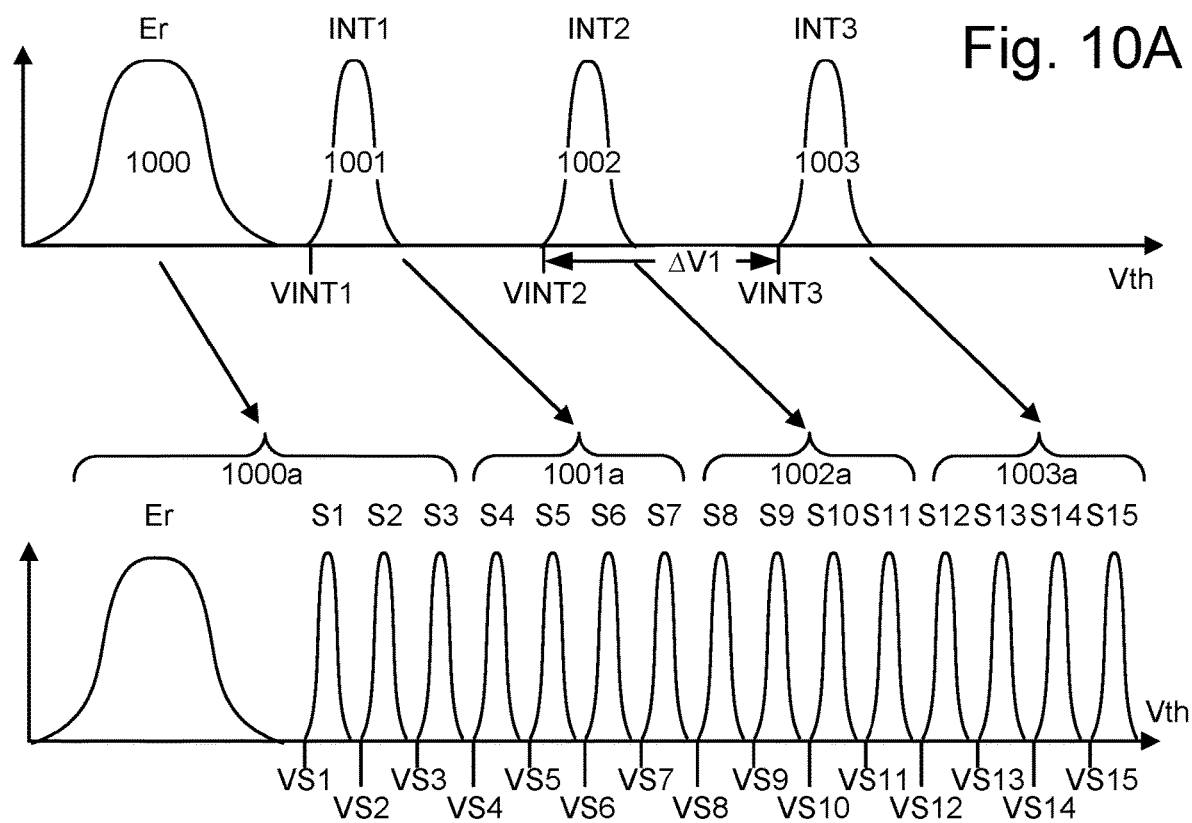

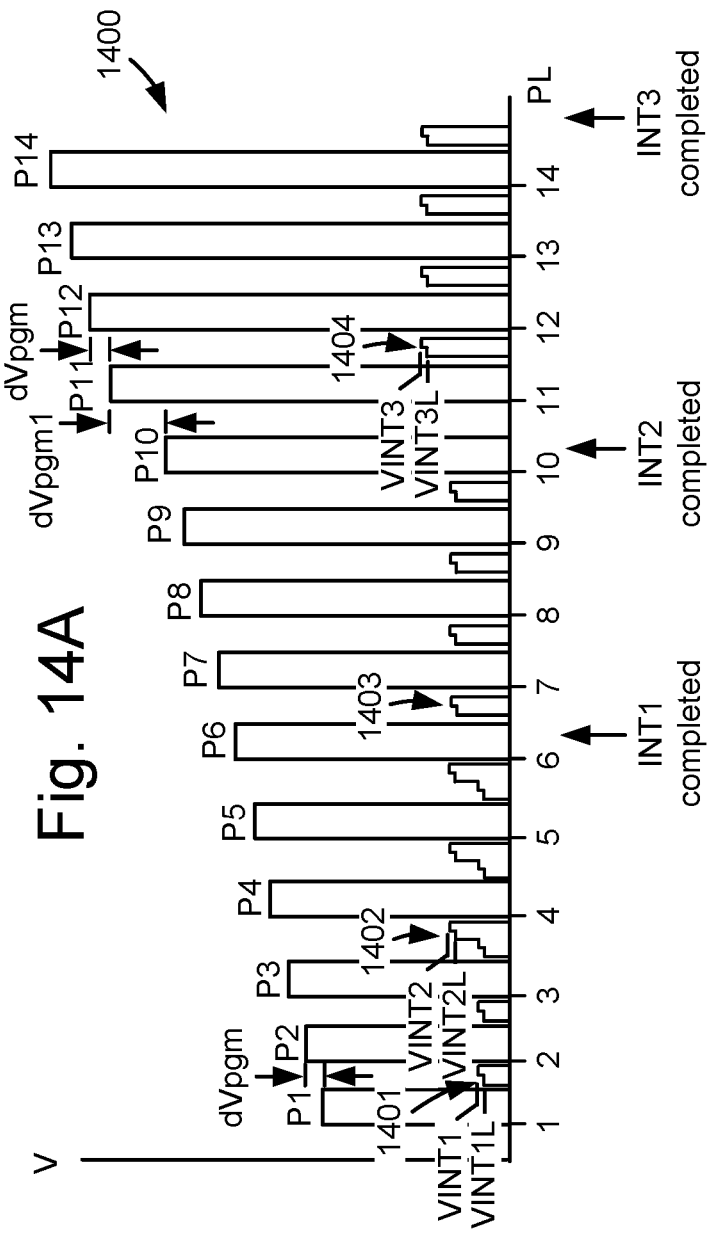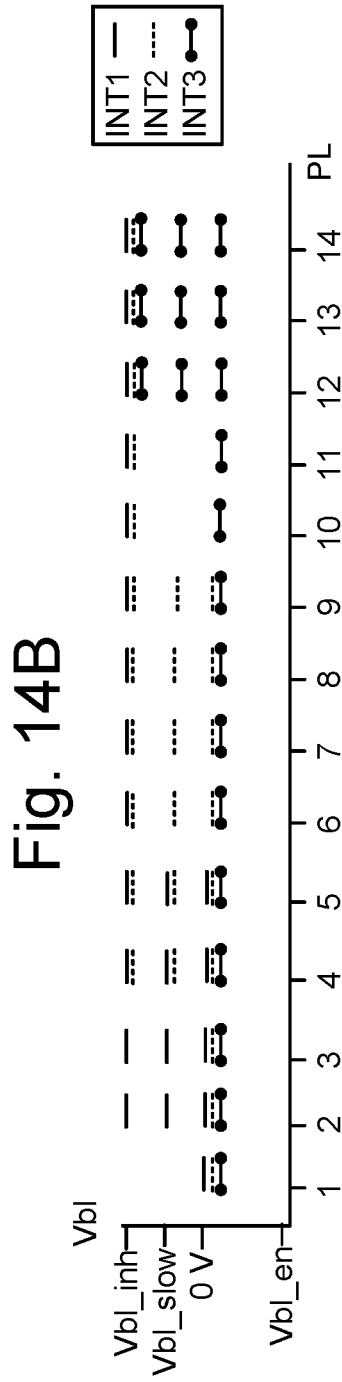

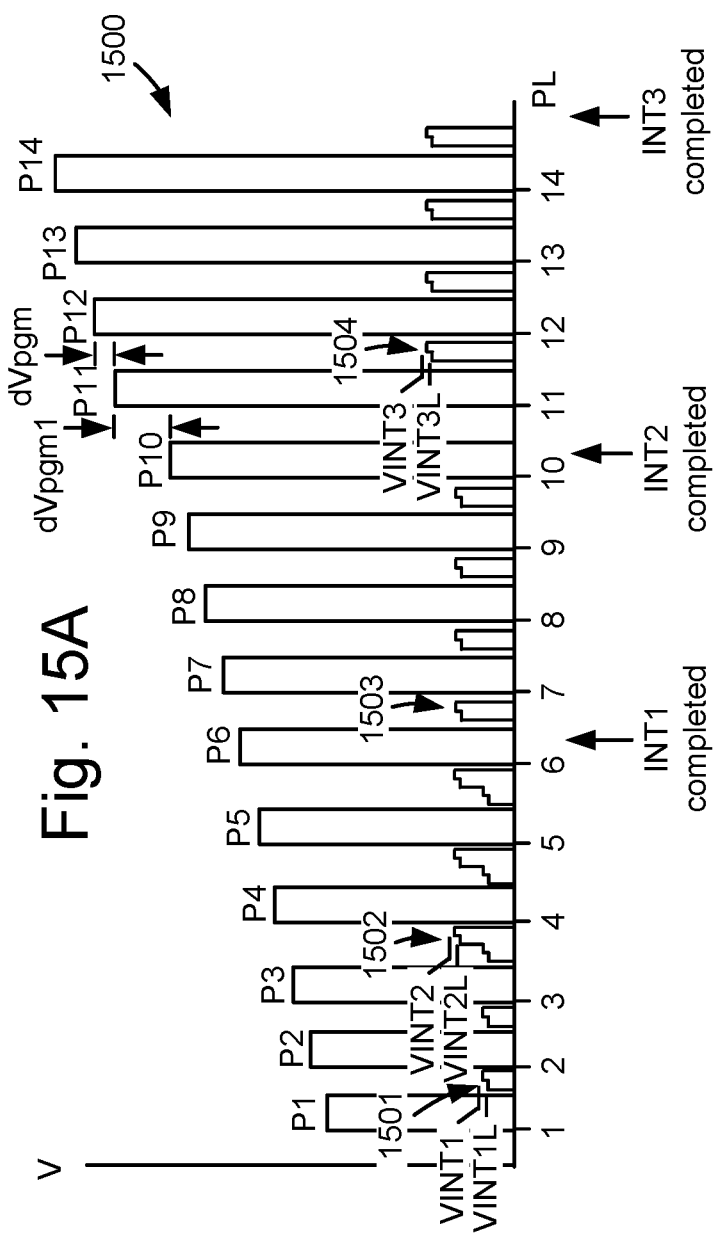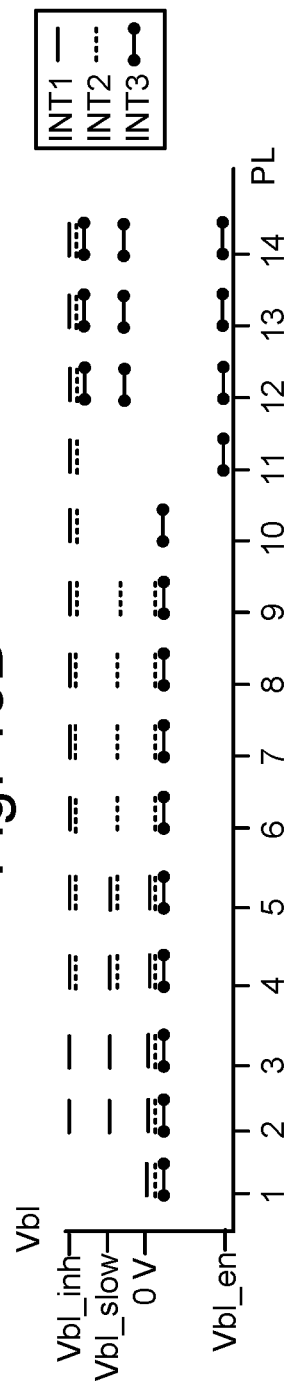

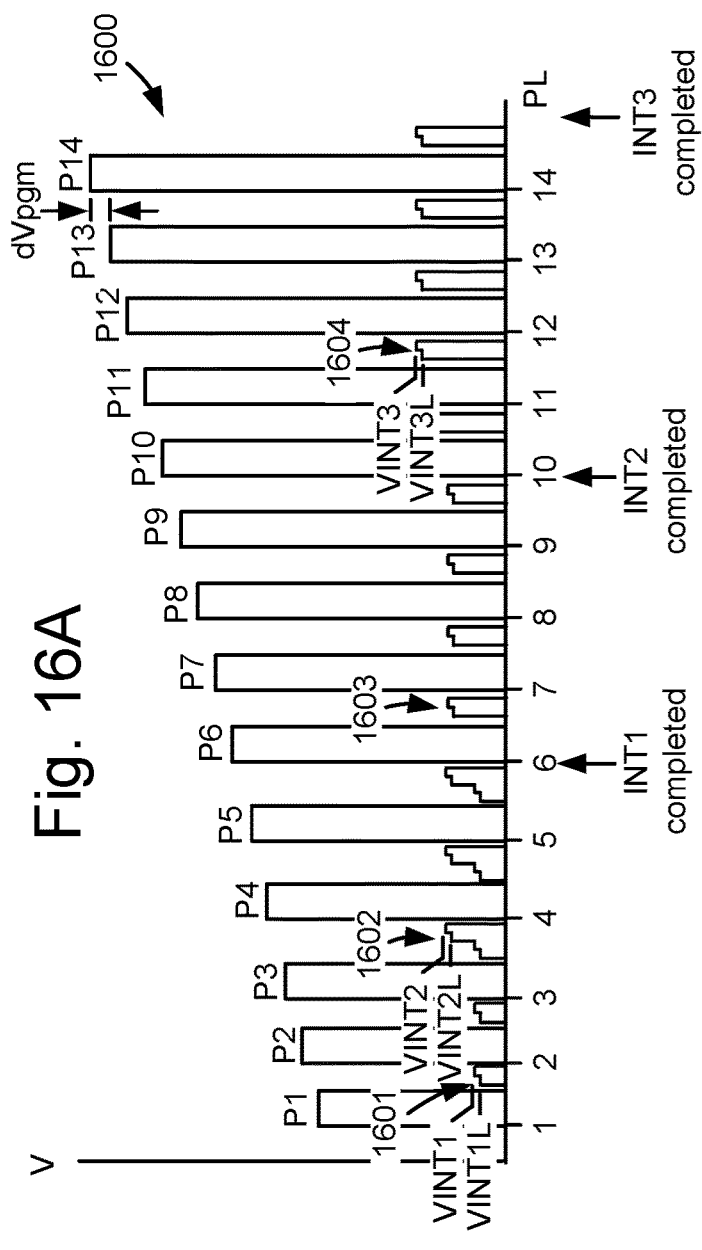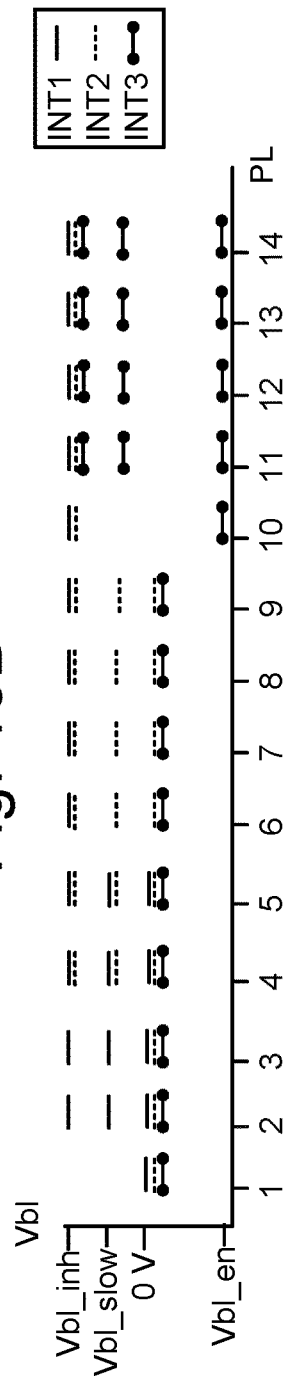

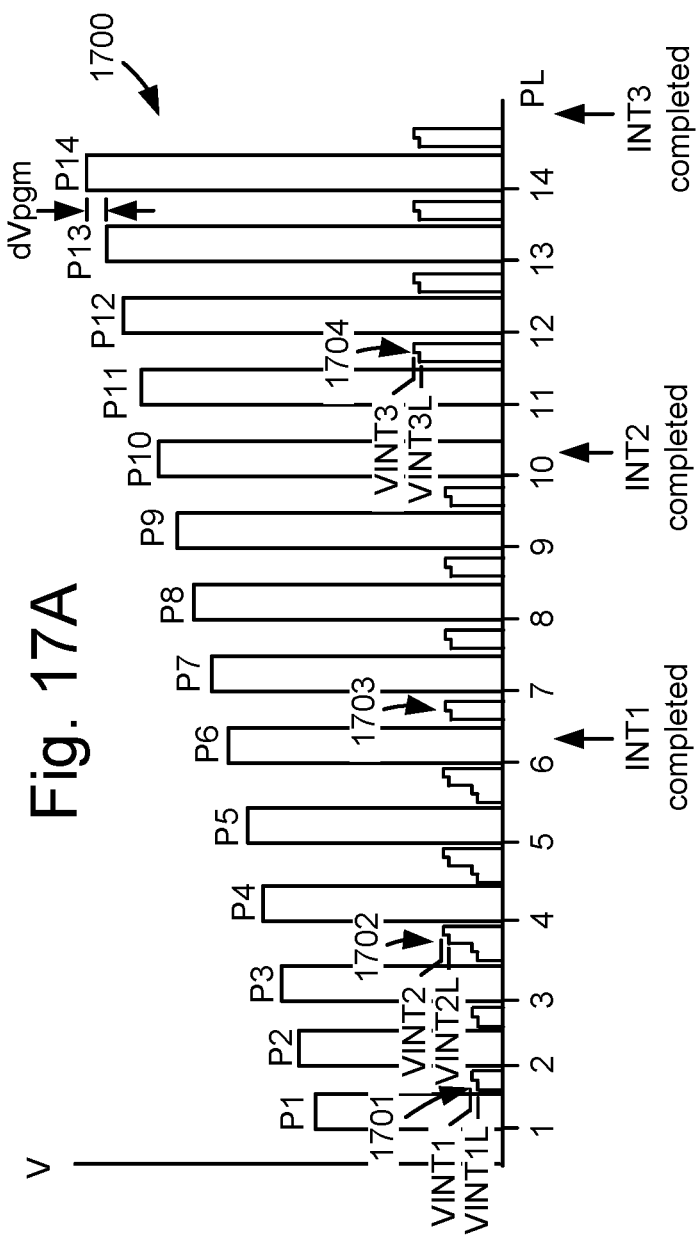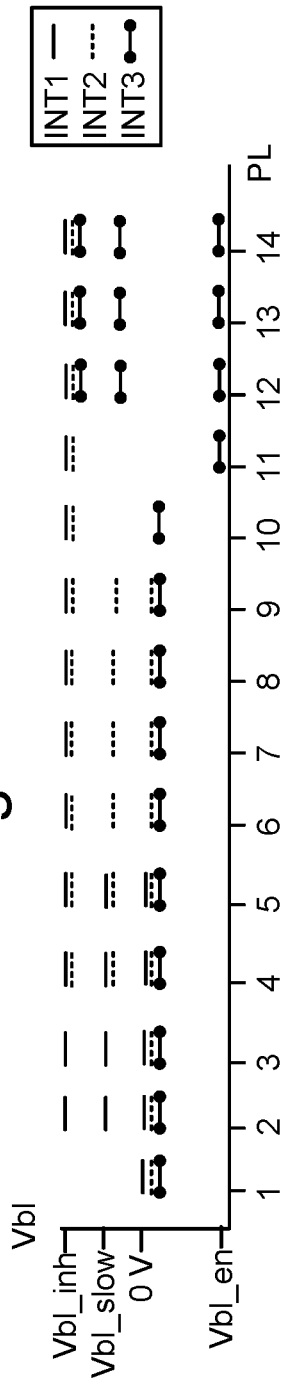

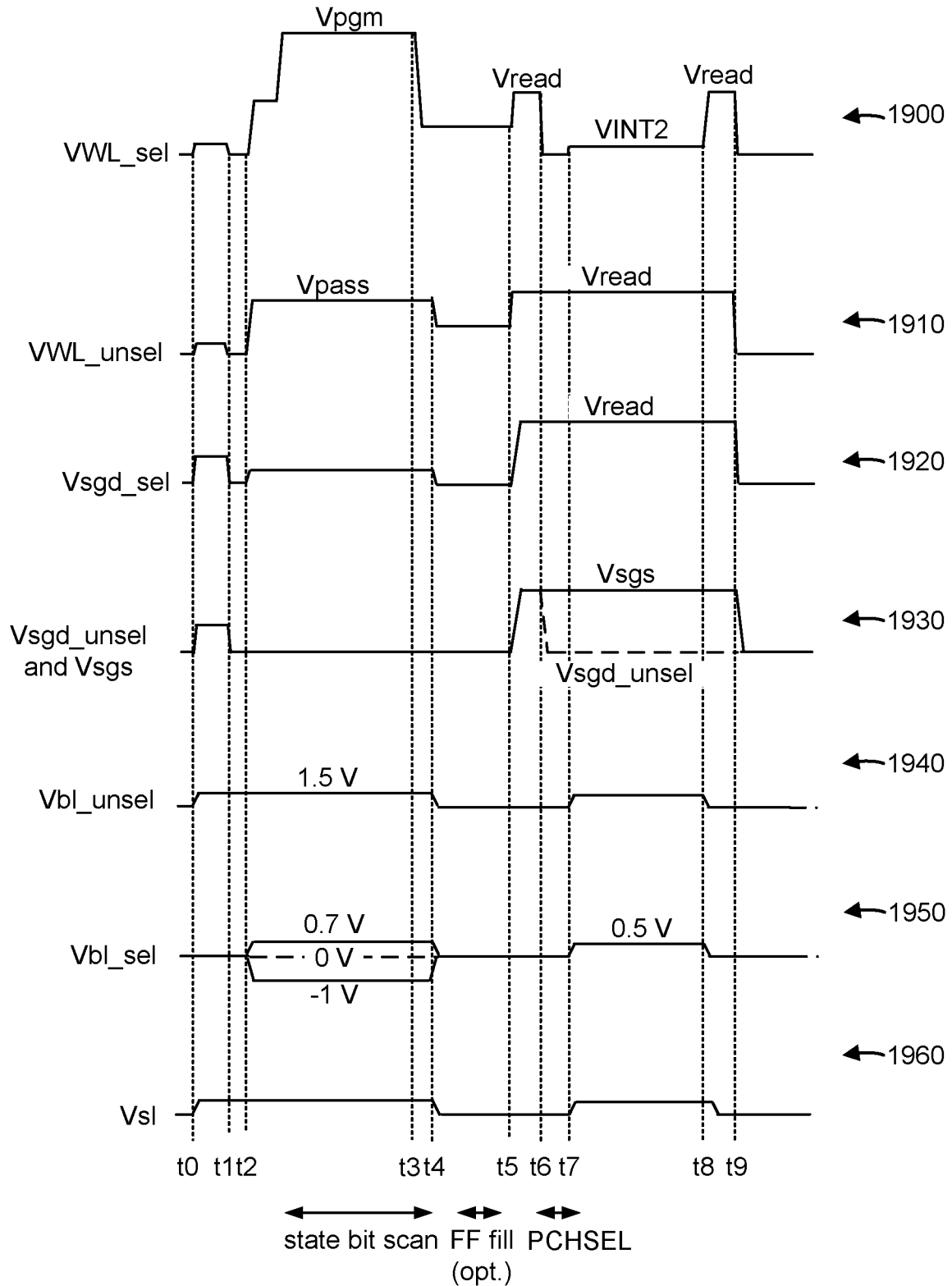

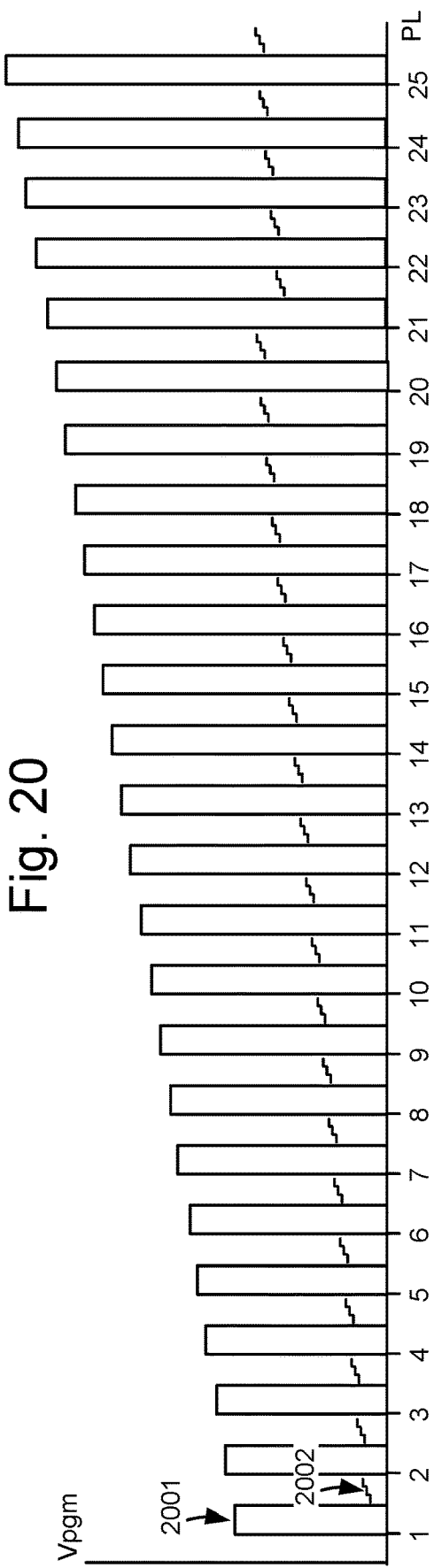

REDUCED PROGRAM TIME FOR MEMORY CELLS USING NEGATIVE BIT LINE VOLTAGE FOR ENHANCED STEP UP OF PROGRAM BIAS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 9A depicts an example Vth distribution of a set of memory cells after a first program pass, including an erased state and three intermediate states, INT1-INT3, along with final and offset verify voltages.

FIG. 9B depicts an example Vth distribution of a set of memory cells after a second program pass, following the first program pass of FIG. 9A, including an erased state and fifteen final states, S1-S15, along with final and offset verify voltages.

FIG. 9C depicts an example bit encoding for the data states of FIGS. 9A and 9B.

FIG. 10A depicts an example Vth distribution of a set of memory cells after a first program pass, including an erased state and three intermediate states, INT1-INT3, a small spacing ΔV1 between the INT2 and INT3 states, and a transition in a second program pass.

FIG. 10B depicts an example Vth distribution of a set of memory cells after a second program pass, following the first program pass of FIG. 10A.

FIG. 14A depicts a plot of a selected word line voltage versus program loop number in a first pass of a program operation, consistent with FIG. 13, where a program bias is stepped up by an enhanced amount by stepping up a program voltage by a larger than nominal amount.

FIG. 14B depicts a plot of bit line voltage versus program loop number consistent with FIG. 14A.

FIG. 15A depicts a plot of a selected word line voltage versus program loop number in a first pass of a program operation, consistent with FIG. 13, where a program bias is stepped up by an enhanced amount by stepping up a program voltage by a larger than nominal amount and by applying a negative bit line voltage.

FIG. 15B depicts a plot of bit line voltage versus program loop number consistent with FIG. 15A.

FIG. 16A depicts a plot of a selected word line voltage versus program loop number in a first pass of a program operation, consistent with FIG. 13, where a program bias is stepped up in PL10 by an enhanced amount by applying a negative bit line voltage, based on a determination made in PL9 that programming of the memory cells assigned to INT2 is completed.

FIG. 16B depicts a plot of bit line voltage versus program loop number consistent with FIG. 16A.

FIG. 17A depicts a plot of a selected word line voltage versus program loop number in a first pass of a program operation, consistent with FIG. 13, where a program bias is stepped up by an enhanced amount in PL11 by applying a negative bit line voltage, based on a determination made in PL10 that programming of the memory cells assigned to INT2 is completed.

FIG. 17B depicts a plot of bit line voltage versus program loop number consistent with FIG. 17A.

FIG. 19 depicts example plots for various voltage signals in a program loop of a first program pass consistent with FIG. 13-18B.

FIG. 20 depicts a plot of a selected word line voltage versus program loop number in a second pass of a program operation, consistent with FIG. 13.

DETAILED DESCRIPTION

Figure 1A:
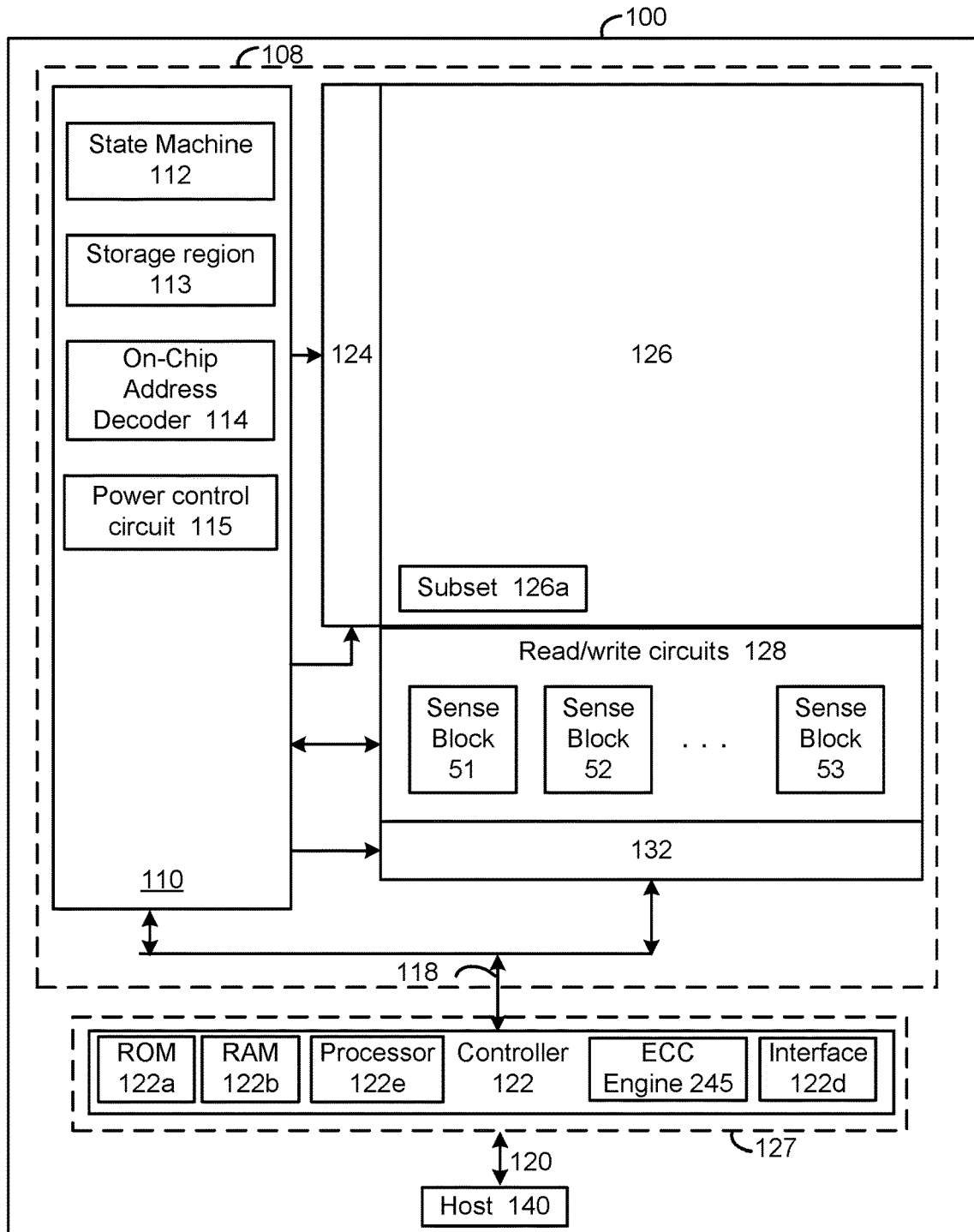
FIG. 1A is a block diagram of an example memory device.

Apparatuses and techniques are described for reducing the program time for a set of memory cells by using an enhanced step up of a program bias. In one approach, the enhanced step up is provided using a negative bit line voltage.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer.

In a 2D memory structure, the memory cells may be arranged in horizontal NAND strings on a substrate.

The memory cells can be programmed to have a threshold voltage (Vth) which corresponds to a data state. The Vth is a function of an amount of charge stored in a charge storing material of the memory cell. A program operation can include a sequence of program loops, where each program loop is performed by applying a program pulse to a selected word line followed by performing one or more verify tests. However, it is difficult to accurately program the memory cells as the number of data states increases to meet the desire for increased storage density. One approach is to program the memory cells in a first program pass to intermediate states, and then in a second program pass from the intermediate states to the final states. This reduces the Vth change in a program pass so that the Vth can be more finely set and so that interference with the Vth of previously programmed memory cells on other word lines is reduced, such as due to neighbor word line disturb.

However, there is a time penalty in performing multiple program passes.

Techniques provided herein address the above and other issues. In one approach, the program time of the first program pass is reduced by providing an enhanced step up of a program bias, e.g., a gate-to-drain voltage, for some memory cells at a specified time in the program pass. In one approach, the enhanced step up is provided by applying a negative bit line voltage in place of a nominal, ground bit line voltage during a program pulse. A negative bit line voltage provides a stronger Fowler-Nordheim field to accelerate the program speed. The enhanced step up in the program bias can also be provided using a larger than nominal step size for the program pulse.

The enhanced step up can be provided by determining when memory cells assigned to a target intermediate state reach a program milestone, such as completion of programming, or having at least a specified portion of the cells pass a verify test. When the milestone is reached, the enhanced step up is provided for memory cells assigned to a higher intermediate state during the applying of a next program pulse.

The enhanced step up increases the Vth of the memory cells by a larger than nominal amount so that the first pass can be completed in fewer program loops. The Vth increase in each program loop may be limited to the nominal amount before the program milestone is reached. The enhanced step up can be limited to a single program loop, in one approach, so that a one-time extra boost of the Vth is achieved. Subsequently in the first program pass, a nominal step in the program bias is used.

For example, the target intermediate state can be a second highest intermediate state, and the higher intermediate state can be a highest intermediate state.

The amount of the enhanced step up can be a function of a spacing between verify voltages of the target intermediate state and the higher intermediate state. A greater enhanced step up is used when the spacing is greater.

A first verify test for the memory cells assigned to the higher intermediate state can be delayed in the first program pass until it is determined that the program milestone is reached for the target intermediate state. This also saves time by avoiding unnecessary verify tests.

Also, to reduce program time, a verify test can be omitted in a program loop in which a determination is made that the program milestone is reached.

The techniques can be used where a slow program mode is provided by adjusting a bit line voltage during a program pulse.

The techniques can be applied to existing and emerging non-volatile memory technologies which store multiple bits per memory cell.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having a circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122*e*, memory such as ROM 122*a* and RAM 122*b* and an error-correction code (ECC) engine 245. The ECC engine can correct a number of read errors. The RAM 122*b* can be a DRAM which stores non-committed data, for example. During programming, a copy of the data to be programmed is stored in the RAM 122*b* until the programming is successfully completed. In response to the successful completion, the data is erased from the RAM 122*b* and is committed or released to the block of memory cells. The RAM 122*b* may store one or more word lines of data.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively or additionally, the processor can access code from a subset 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*e* fetches the boot code from the ROM 122*a* or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
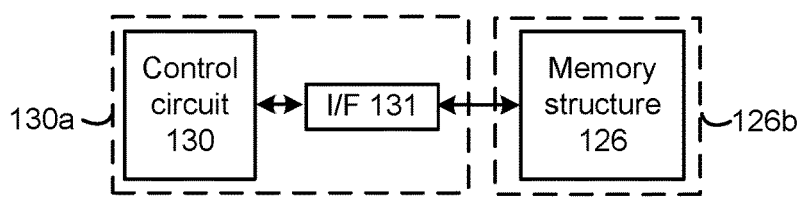
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130*a* and another portion of the read/write circuits are located on memory die 126*b*. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. The circuit can be configured to issue command via the memory interface to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
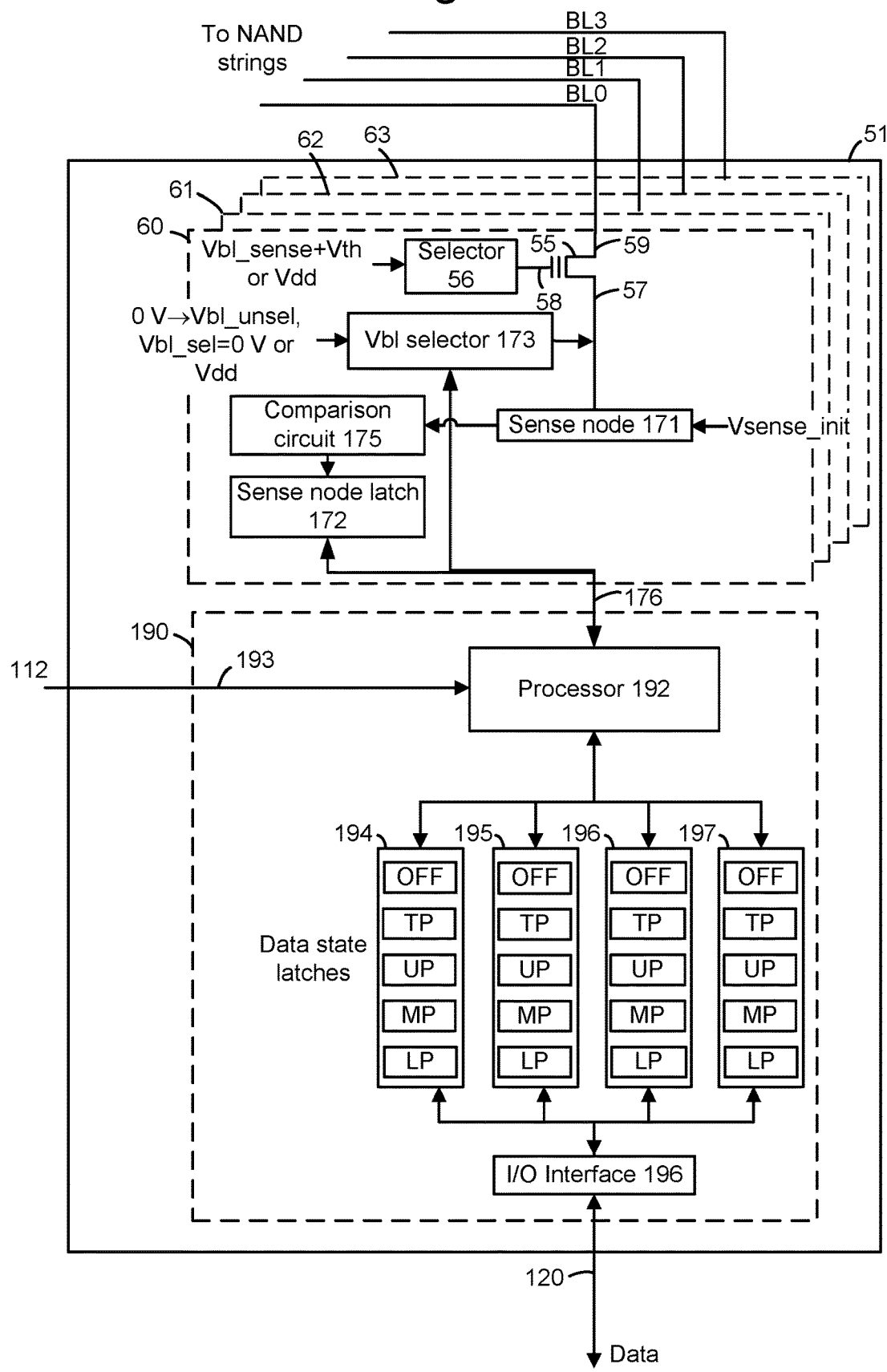
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg–Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg–Vcelsrc–Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation. See also FIG. 19.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of five data latches, e.g., comprising individual latches LP, MP, UP, TP and OFF, can be provided for each sense circuit. In some cases, a different number of data latches may be used. The optional offset latch (OFF) tracks whether a memory cell has completed a verify test using an offset verify voltage, which is lower than the final verify voltage of a data state. See examples of offset verify voltages in FIGS. 9A and 9B.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operations. For example, latches may identify that a memory cell's Vth is below a particular verify voltage. The data latches indicate whether a memory cell currently stores one or more bits from a page of data. For example, the LP, MP, UP or TP latches can be flipped (e.g., from 0 to 1) when a lower, middle, upper or top page bit, respectively, is stored in an associated memory cell. All 1's in the latches indicate that an associated memory cell has completed programming.

Figure 3:
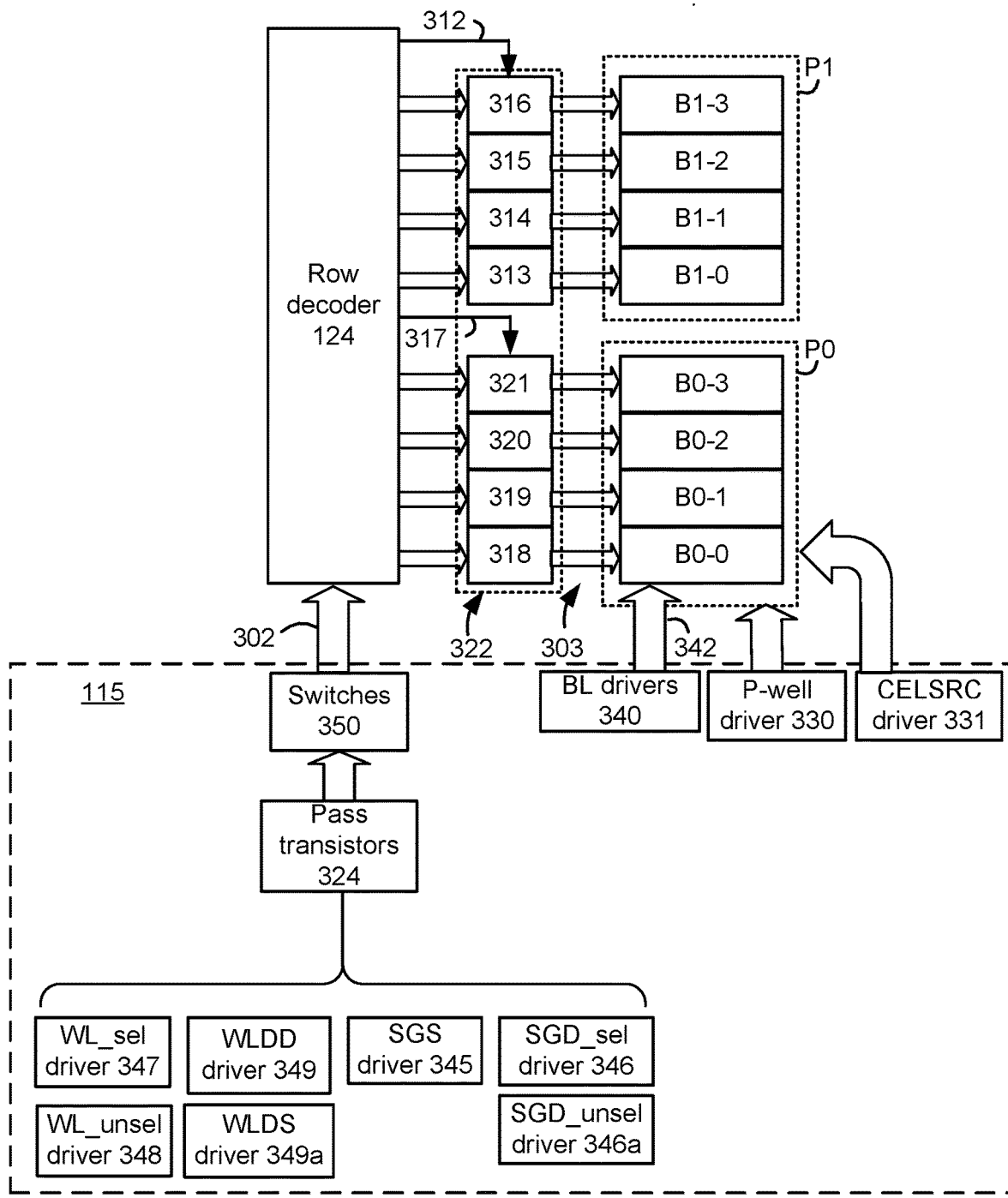
FIG. 3 depicts an example implementation of the power control circuit 115 of FIG. 1A for providing voltages to blocks of memory cells.
Figure 7:
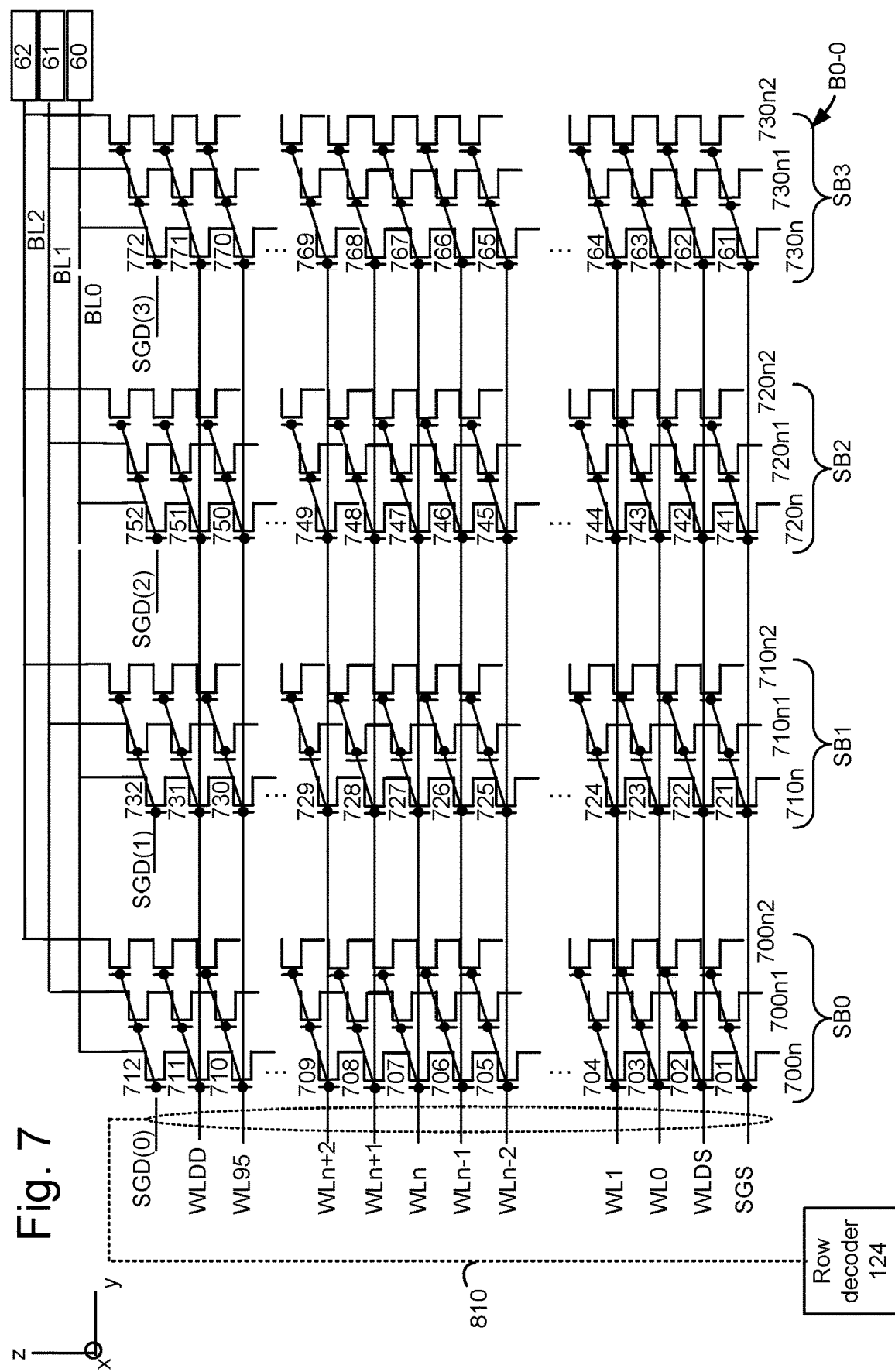
FIG. 7 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 4:
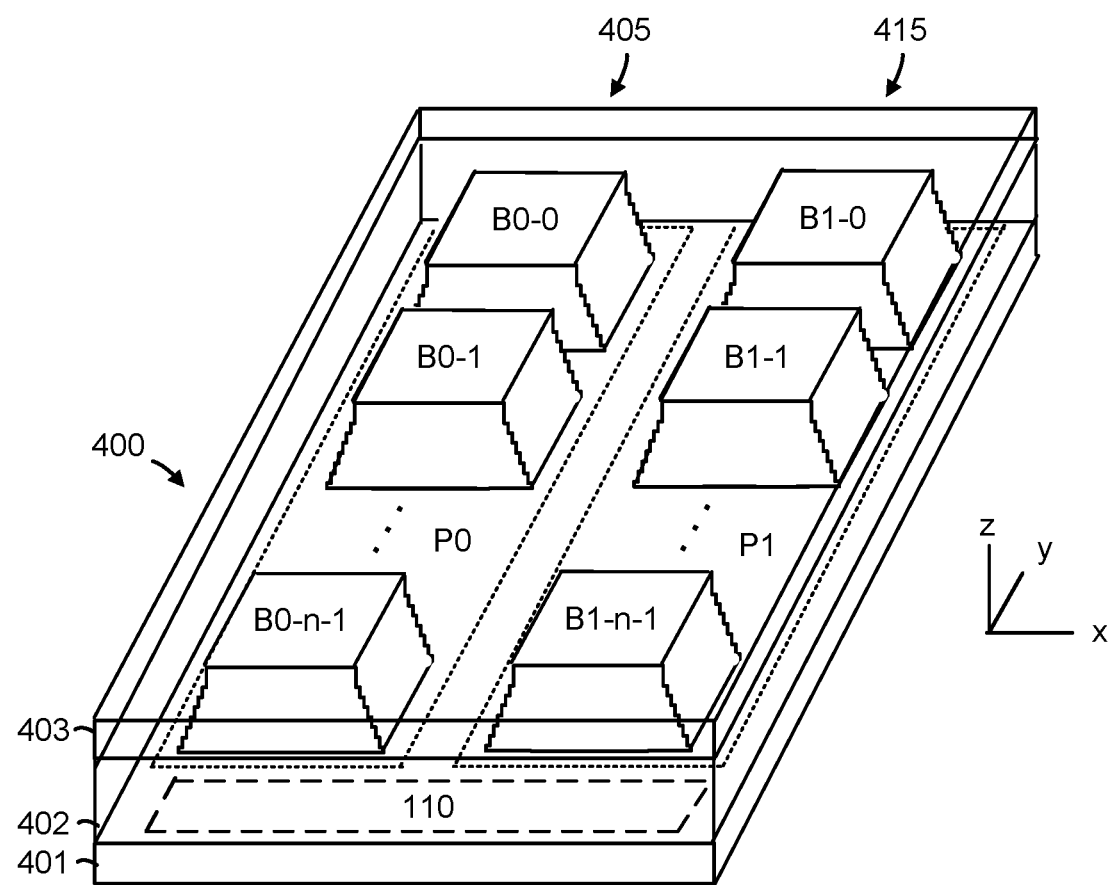
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in different planes can be erased concurrently.

The substrate 401 can also carry circuitry under the blocks, and one or more lower metal layers which are patterned in conductive paths to carry signals of the circuitry.

Figure 5:
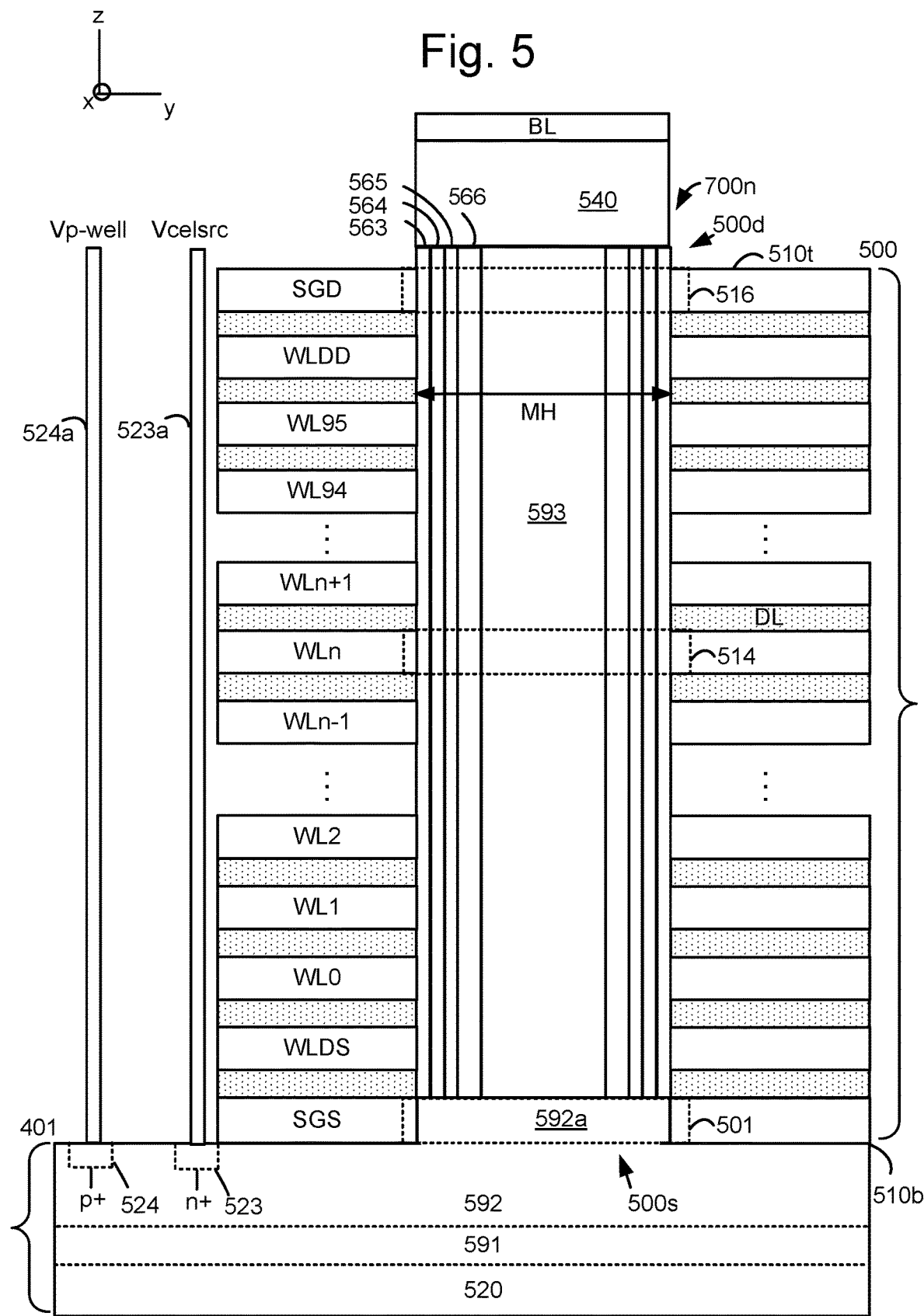
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn−1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
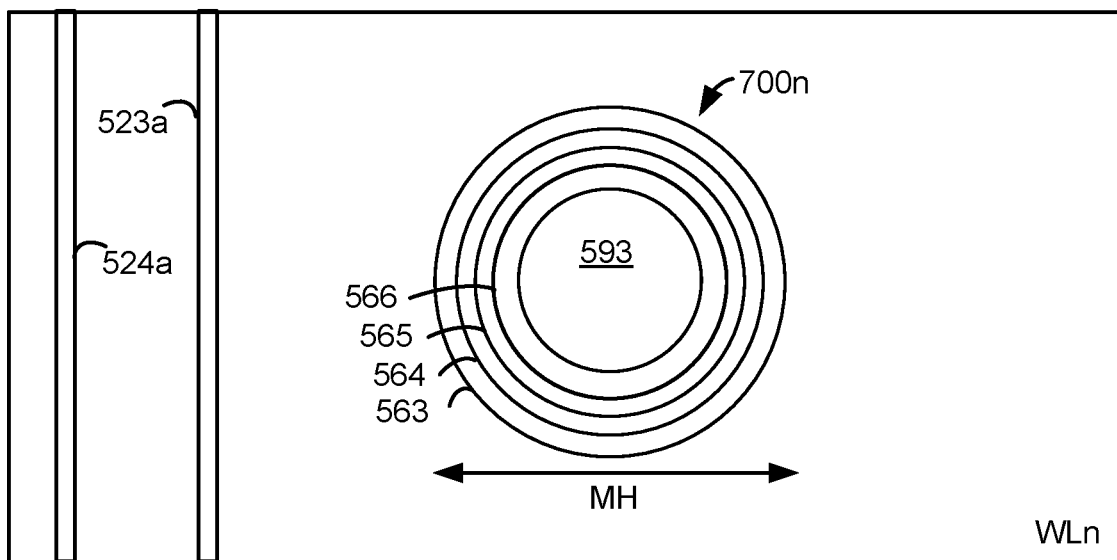
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can reduce neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via contacts 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 8:
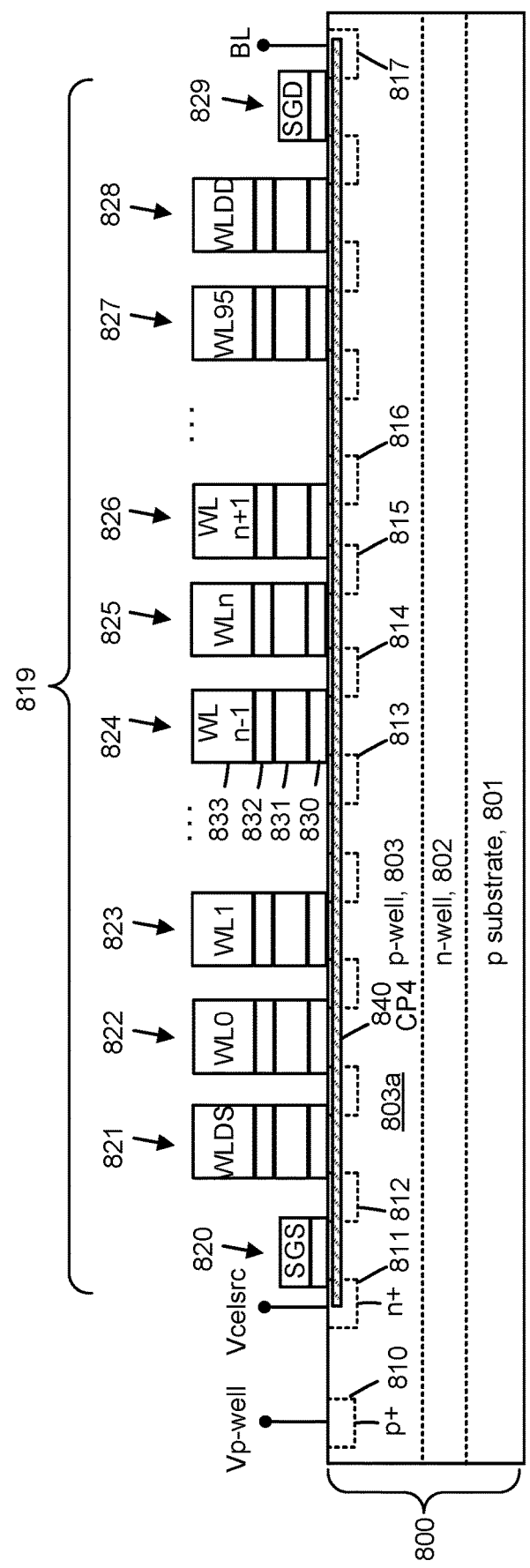
FIG. 8 depicts an example NAND string in a 2D configuration.

FIG. 8 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunnel oxide layer 830, a floating gate layer 831, a blocking oxide layer 832 and a control gate 833.

FIG. 9A depicts an example Vth distribution of a set of memory cells after a first program pass, including an erased state and three intermediate states, INT1-INT3, along with final and offset verify voltages. In FIGS. 9A, 9B and 10A-12B, the vertical axis depicts a number of memory cells on a logarithmic scale and the horizontal axis depicts a threshold voltage on a linear scale. The Vth distributions can represent a set of memory cells connected to a selected word line. After erasing the block, the Vth distribution of plot 900 is obtained, representing the erased state. The erase operation is completed when the Vth of all, or nearly all, of the memory cells is below a verify voltage for the erased states.

The memory cells are then subject to a programming operation in a first program pass. Each of the memory cells will have an assigned data state in the first program pass based on a bit encoding such as in FIG. 9C. For example, for each memory cell, the LP and MP bits together define one assigned state for the first pass among the Er, INT1, INT2 and INT3 states. The first program pass thus involves multiple bits per cell or MLC programming. If the Er state is assigned, the memory cell is not programmed. If the INT1-INT3 state is assigned, the memory cell is programmed to the corresponding Vth distribution 901-903, respectively. The first program pass involves applying successive program pulses, each of which is followed by one or more verify tests using verify voltages VINT1-VINT3 for INT1-INT3, respectively. Optionally, a lower verify voltage VINT1L-VINT3L is also used for INT1-INT3, respectively. A memory cell which has a Vth above the lower verify voltage but below the final verify voltage of its assigned state is subject to a slow program mode. A memory cell which has a Vth above the final verify voltage of its assigned state is inhibited from further programming. A memory cell which has a Vth below the lower verify voltage is subject to a normal program mode.

The slow program mode helps provide narrower Vth distributions. The OFF latch discussed in connection with FIG. 2 can be used to indicate whether the slow program mode is active.

FIG. 9B depicts an example Vth distribution of a set of memory cells after a second program pass, following the first program pass of FIG. 9A, including an erased state and fifteen final states, S1-S15, along with final and offset verify voltages. Each of the memory cells has an assigned data state in the second program pass based on a bit encoding such as in FIG. 9C. For example, for each memory cell, the LP, MP, UP and TP bits together define one of the Er/S0-S15 states. If the Er state is assigned, the memory cell is not programmed. If the S1-S15 state is assigned, the memory cell is programmed to the assigned state from the Er distribution or from one of the INT1-INT3 distributions. This is done based on various mapping from the Er and INT1-INT3 states to the Er/S0-S15 states, as discussed further below.

The second program pass involves applying successive program pulses, each of which is followed by one or more verify tests using final verify voltages VS1-VS15 for S1-S15, respectively. Optionally, a lower verify voltage VS1L-VS15L is also used for S1-S15, respectively, to invoke a slow program mode.

FIG. 9C depicts an example bit encoding for the data states of FIGS. 9A and 9B. The table lists pages LP, MP, UP and TP and final data states Er/S0-S15. LP and MP represent the first pass data and UP and TP represent the second pass data. The second program pass also requires the LP and MP data to identify the assigned data states in the second program pass. A set of bits which is all 1's indicates the Er/S0 state. A memory cell which completes programming to one of the S1-S15 states has its bits set to all 1's to indicate that programming is completed.

FIG. 10A depicts an example Vth distribution of a set of memory cells after a first program pass, including an erased state and three intermediate states, INT1-INT3, a small spacing $\Delta V1$ between the INT2 and INT3 states, and a transition in a second program pass. The Vth distributions 1000, 1001, 1002 and 1003 represent the Er, INT1, INT2 and INT3 states, respectively. $\Delta V1$ is a spacing between the verify voltages of the INT2 and INT3 states.

In one option, an enhanced program bias step up for the memory cells assigned to INT3 is not used since $\Delta V1$ is relatively small. In this case, there is a risk that the enhanced program bias step up over programs INT3 memory cells.

In another option, a relatively small enhanced program bias step up is used for the memory cells assigned to INT3 since $\Delta V1$ is relatively small. Examples of an enhanced program bias step up are provided further below.

FIG. 10B depicts an example Vth distribution of a set of memory cells after a second program pass, following the first program pass of FIG. 10A. The states are provided in successive groups 1001a-1003a which represent a mapping from the Er, INT1, INT2 and INT3 states, respectively. For the group 1000a, memory cells assigned to the S1-S3 states are programmed from the Er state. For the group 1001a, memory cells assigned to the S4-S7 states are programmed from INT1. For the group 1002a, memory cells assigned to the S8-S11 states are programmed from INT2. For the group 1003a, memory cells assigned to the S12-S15 states are programmed from INT3.

Figures 11A, 11B:
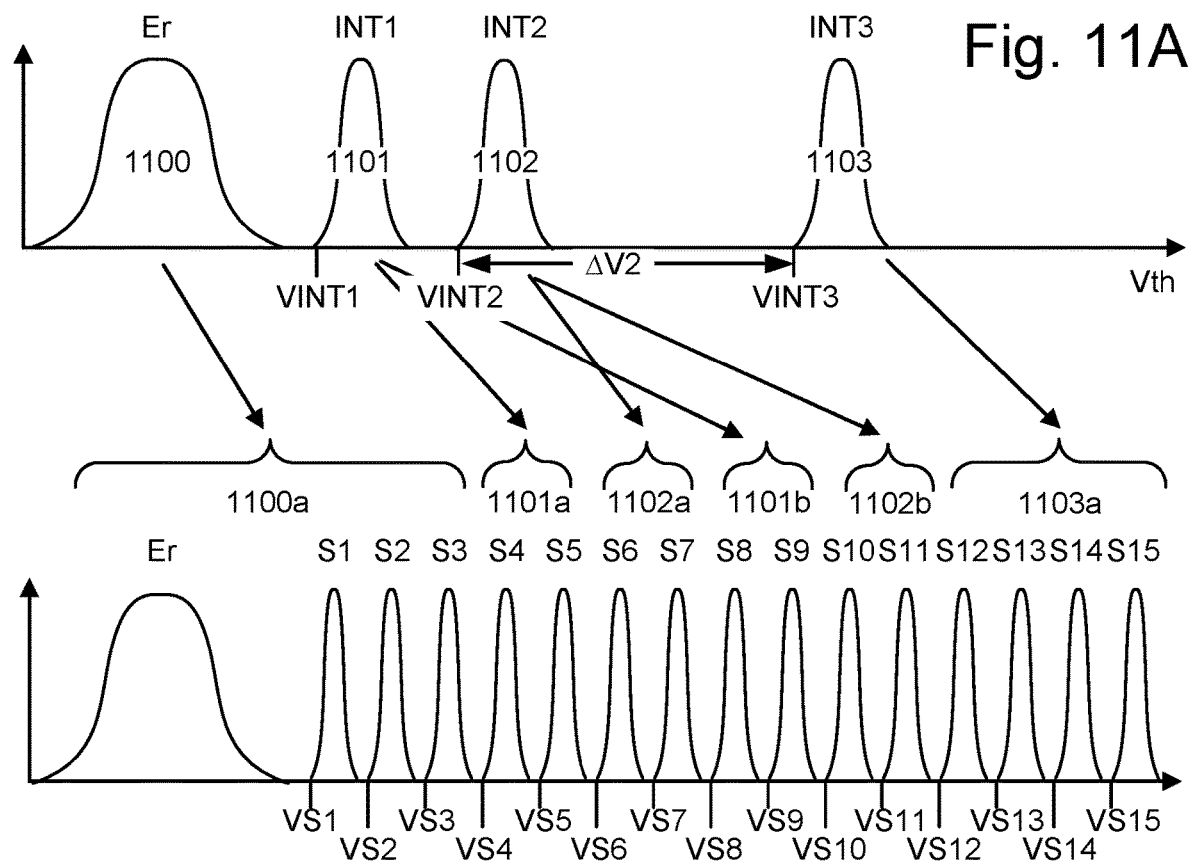
FIG. 11A depicts an example Vth distribution of a set of memory cells after a first program pass, including an erased state and three intermediate states, INT1-INT3, a medium spacing ΔV2 between the INT2 and INT3 states and a transition in a second program pass.
FIG. 11B depicts an example Vth distribution of a set of memory cells after a second program pass, following the first program pass of FIG. 11A.

FIG. 11A depicts an example Vth distribution of a set of memory cells after a first program pass, including an erased state and three intermediate states, INT1-INT3, a medium spacing $\Delta V2$ between the INT2 and INT3 states and a transition in a second program pass. The Vth distributions 1100, 1101, 1102 and 1103 represent the Er, INT1, INT2 and INT3 states, respectively. $\Delta V2>\Delta V1$ is a spacing between the verify voltages of the INT2 and INT3 states.

In one option, a medium enhanced program bias step up is used for the memory cells assigned to INT3 since $\Delta V2$ is medium sized.

FIG. 11B depicts an example Vth distribution of a set of memory cells after a second program pass, following the first program pass of FIG. 11A. The states are provided in groups 1100a, 1101a and 1101b, 1102a and 1102b, and 1103a which represents a mapping from the Er, INT1, INT2 and INT3 states, respectively. That is, for the group 1100a, memory cells assigned to the S1-S3 states are programmed from the Er state. For the group 1101a, memory cells assigned to the S4 and S5 states are programmed from INT1. For the group 1102a, memory cells assigned to the S6 and S7 states are programmed from INT2. For the group 1101b, memory cells assigned to the S8 and S9 states are programmed from INT1. For the group 1102b, memory cells assigned to the S10 and S11 states are programmed from INT2. For the group 1103a, memory cells assigned to the S12-S15 states are programmed from INT3.

Figure 12A:
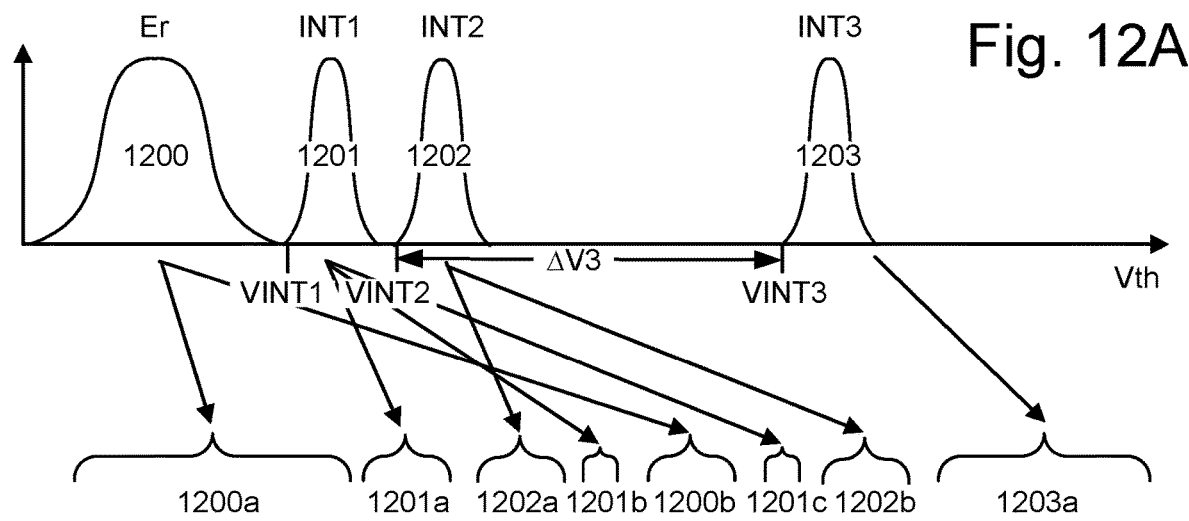
FIG. 12A depicts an example Vth distribution of a set of memory cells after a first program pass, including an erased state and three intermediate states, INT1-INT3, a large spacing ΔV3>ΔV2>ΔV1 between the INT2 and INT3 states and a transition in a second program pass.

FIG. 12A depicts an example Vth distribution of a set of memory cells after a first program pass, including an erased state and three intermediate states, INT1-INT3, a large spacing $\Delta V3>\Delta V2>\Delta V1$ between the INT2 and INT3 states and a transition in a second program pass. The Vth distributions 1200, 1201, 1202 and 1203 represent the Er, INT1, INT2 and INT3 states, respectively. $\Delta V3>\Delta V2$ is a spacing between the verify voltages of the INT2 and INT3 states.

In one option, a relatively large enhanced program bias step up is used for the memory cells assigned to INT3 since $\Delta V2$ is relatively large.

Figure 12B:
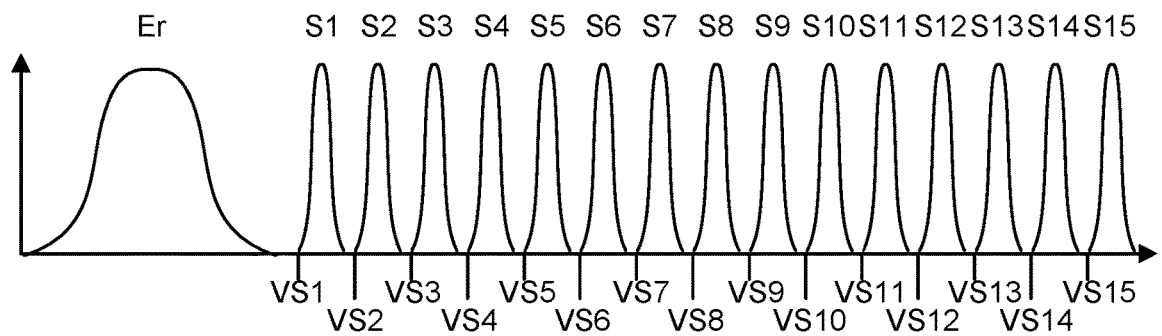
FIG. 12B depicts an example Vth distribution of a set of memory cells after a second program pass, following the first program pass of FIG. 12A.

FIG. 12B depicts an example Vth distribution of a set of memory cells after a second program pass, following the first program pass of FIG. 12A. The states are provided in groups 1200a and 1200b, 1201a-1201c, 1202a and 1202b, and 1203a, which represents a mapping from the Er, INT1, INT2 and INT3 states, respectively. That is, for the group 1200a, memory cells assigned to the S1 state are programmed from the Er state. For the group 1201a, memory cells assigned to the S2 and S3 states are programmed from INT1. For the group 1202a, memory cells assigned to the S4 and S5 states are programmed from INT2. For the group 1201b, memory cells assigned to the S6 state are programmed from INT1. For the group 1200b, memory cells assigned to the S7 and S8 states are programmed from the Er state. For the group 1201c, memory cells assigned to the S9 state are programmed from INT1. For the group 1202b, memory cells assigned to the S10 and S11 states are programmed from INT2. For the group 1203a, memory cells assigned to the S12-S15 states are programmed from INT3.

The various mappings of FIG. 10A-12B have different advantages in terms of minimizing read time, read errors and write-abort protection. For example, the mapping of FIGS. 10A and 10B is a 1-2-6-6 mapping, where the lower, middle, upper and top pages are defined by 1, 2, 6 and 6 read voltages, e.g., VS8; VS4 and VS12; VS2, VS5, VS7, VS9, VS11 and VS14; and VS1, VS3, VS6, VS10, VS13 and VS15; respectively. See also FIG. 9B. The mapping of FIGS. 11A and 11B is a 2-3-5-5 mapping, where the lower, middle, upper and top pages are defined by 2, 3, 5 and 5 read voltages, e.g., VS4 and VS12; VS8, VS8 and VS10; VS2, VS7, VS11, VS13 and VS15; and VS1, VS3, VS5, VS9 and VS14; respectively. The mapping of FIGS. 12A and 12B is a 3-4-4-4 mapping, where the lower, middle, upper and top pages are defined by 3, 4, 4 and 4 read voltages, e.g., VS4, VS6 and VS10; VS2, VS7, VS9 and VS12; VS5, VS11, VS13 and VS15; and VS1, VS3, VS8 and VS14; respectively. The three mappings have good resistance to neighbor word line interference.

The 1-2-6-6 mapping results in a longer read time and higher risk of read errors for the pages which require six read voltages. The 3-4-4-4 mapping has the highest risk of overlap between the states after the first program pass due to the relatively small margin between the Er, INT1 and INT2 states (FIG. 12A).

Figure 13:
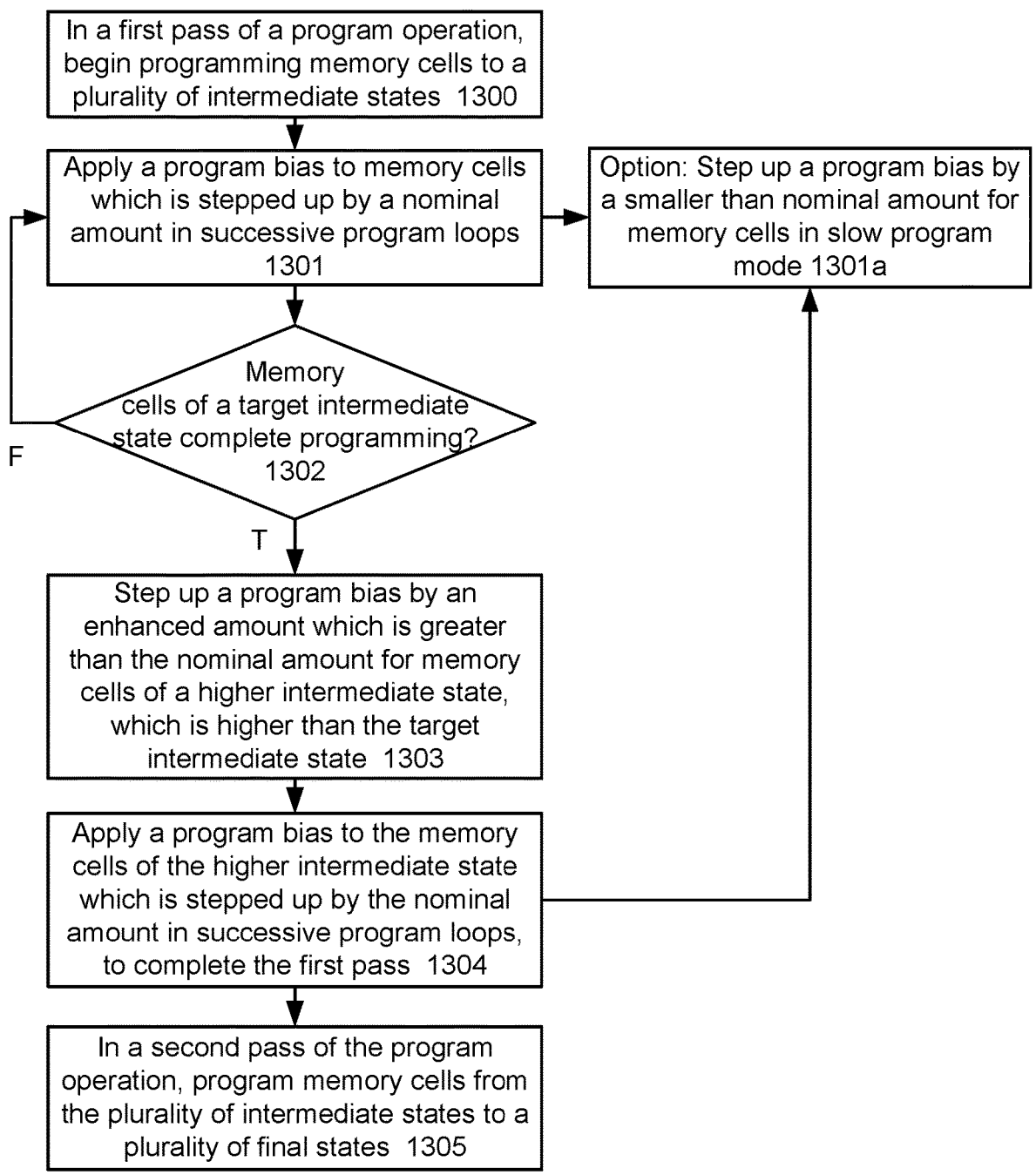
FIG. 13 depicts a flowchart of an example program operation which includes a first pass and a second pass, where a program bias is stepped up by an enhanced amount at a specified time in the first pass to reduce the program time.

FIG. 13 depicts a flowchart of an example program operation which includes a first pass and a second pass, where a program bias is stepped up by an enhanced amount at a specified time in the first pass to reduce the program time. For example, the number of program loops used to complete the first program pass may be reduce by one or more program loops. Step 1300 includes, in a first pass of a program operation, beginning programming memory cells to a plurality of intermediate states, e.g., INT1-INT3. Step 1301 includes applying a program bias to the memory cells which is stepped up by a nominal amount in successive program loops. The program bias can comprise a program pulse, for example. The stepping up of the program bias by the nominal, e.g., baseline, amount can involve stepping up the program pulse by a nominal, fixed step size. The program bias can be a gate-to-drain voltage of a memory cell. A larger step up in the gate-to-drain results in a larger increase in Vth for a memory cell, in a given program loop. Optionally, step 1301a includes stepping up a program bias by a smaller than nominal amount for memory cells in slow program mode. This can involve applying a positive bit line/drain voltage such as 0.7 V during a program pulse instead of a ground voltage (0 V).

A decision step 1302 involves determining whether memory cells of a target intermediate state complete programming, e.g., whether programming is completed for the target intermediate state. The target intermediate state can be a second highest intermediate state such as INT2, for example. If the decision step 1302 is false (F), step 1301 is repeated. If the decision step 1302 is true, step 1303 involves stepping up a program bias by an enhanced amount which is greater than the nominal amount for memory cells of a higher intermediate state, which is higher than the target intermediate state. The higher intermediate state can be the highest intermediate state such as INT3.

An alternative to step 1302 is to determine whether at least a specified number or portion of memory cells of a target intermediate state pass their verify test and complete programming. This condition can be met in an earlier program loop than a program loop in which programming is completed for the target intermediate state. For example, programming may be completed for INT2 when at least 99% of the memory cells assigned to INT2 pass the verify test, and the specified number may be reached sooner when at least 95% of the memory cells assigned to INT2 pass the verify test.

In one approach, a parameter BSPF (bit scan pass fail) is compared to a count of memory cells in the lower tail of the INT2 state which have Vth<VINT2. For example, we might define BSPF=24 as a threshold to indicate when the INT2 state completes programming, and BSPF=72 as a threshold to indicate when the specified number of INT2 memory cells pass the verify test. If the number of INT2 memory cells with Vth<VINT2 is less than 72, but not less than 24, the enhanced program bias step up is triggered. At the same time, the INT2 state has not yet completed programming. The next program loop will therefore set a Vbl which allows programming for the remaining INT2 state cells, e.g., Vbl_slow or 0 V, and a negative bit line voltage, Vbl_en. If the number of INT2 memory cells with Vth<VINT2 is less than 24, the INT2 state has completed programming and the next program loop will set an inhibit bit line voltage, Vbl_inh, which inhibits programming of all of the INT2 state cells.

Step 1304 involves applying a program bias to the memory cells of the higher intermediate state which is stepped up by the nominal amount in successive program loops, to complete the first pass. Thus, after the extra Vth increase which is obtained at step 1303, the programming returns to a nominal Vth increase in each program loop. The temporary extra Vth increase quickly moves the memory cell closer to its verify level, while the subsequent nominal Vth increases help achieve a narrow Vth distribution and avoid over programming. Step 1301a can also optionally be used.

Step 1305 includes, in a second pass of the program operation, programming memory cells from the plurality of intermediate states to a plurality of final states. In one approach, this programming uses a nominal program bias step up in each program loop, with an option for stepping up a program bias by a smaller than nominal amount for memory cells in slow program mode. The Vth distributions of the final data states may be too close together to use the enhanced program bias step up of the first program pass.

FIG. 14A depicts a plot 1400 of a selected word line voltage versus program loop number in a first pass of a program operation, consistent with FIG. 13, where a program bias is stepped up by an enhanced amount by stepping up a program voltage by a larger than nominal amount. There are fourteen program loops in this example. A respective program pulse P1-P14 is applied in each program loop PL1-PL14, respectively. P2-P10 step up by a nominal voltage step size dVpgm. P11 steps up by a larger than nominal amount, dVpgml, in response to the determination in PL10 that the memory cells assigned to INT2 complete programming. PL11 is the program loop which directly follow PL10. A first verify test for INT3 is also performed in PL11. P12-P14 step up by the nominal step size, dVpgm.

One or more verify voltages are applied after the program pulse in every program loop except PL10. In this example, the lower and final verify voltages of each state are used to provide a finer grained control of the Vth. For example, VINT1L and VINT1 are applied in PL1 (plot 1401) and PL2. VINT1L, VINT1, VINT2L and VINT2 are applied in PL3 (plot 1402), PL4 and PL5. VINT2L and VINT2 are applied in PL6 plot 1403) and PL7-PL9. VINT3L and VINT3 are applied in PL11 (plot 1404) and PL12-PL14.

Some memory cells will program faster than others. The fast memory cells will complete programming and subsequent receive an inhibit bit line voltage, Vbl_inh, at an earlier program loop than for slower programming cells. The completion of the INT1-INT3 programming is based on when the slowest programming cells complete programming. The faster cells will also receive the slow program voltage, Vbl_slow, in an earlier program loop than the slow cells.

A small number of very slow programming cells of each state may be ignored to allow the data state to complete programming. For example, the INT1 state may be considered to complete programming even if a few very slow INT1 cells did not pass the verify test of PL5. These very slow cells may receive Vbl=0 V during the state bit scan which occurs during P6. If the state bit scan indicates only a few non-passing INT1 cells, the programming of the INT1 state is considered to be complete, such that all of the INT1 cells will be inhibited with Vbl_inh at P7 and later program loops in the first pass. A similar situation can occur with INT2 and INT3.

In this example, a determination is made in PL6 that the memory cells assigned to INT1 have completed programming. This is due to a counting process or state bit scan which takes some time to complete after the verify test of PL5. Thus, the memory cells assigned to INT1 completed programming in PL5, but a control circuit does not make this determination until during the application of P6. A lockout scan performed at the end of PL5 ensures that the memory cells assigned to INT1 are inhibited from further programming when P6-P14 are applied. Generally, a lockout scan is performed at the end of each program loop starting with PL1. Any cell that has Vth>verify voltage during the verify test will be lockout out or inhibited from further programming starting with the next program pulse. A bit scan can also be performed for a specified state, such as the INT1 state, during a program pulse, not during the verify test, to determine that no further verify tests for INT1 are needed after a current program pulse is finished.

Also, a determination is made in PL10 that the memory cells assigned to INT2 have completed programming. That is, PL10 is identified as a program loop in which a determination is made that the memory cells assigned to the target intermediate state INT2 have completed programming. In this example, the memory cells assigned to INT2 completed programming in PL9, but a control circuit does not make this determination until during the application of P10. The memory cells assigned to INT3 complete programming in PL14.

A verify test is not performed for any of the plurality of memory cells in the identified program loop, PL10, to save program time. After P10 is applied, only the INT3 memory cells are still being programmed. A verify test is not needed for the INT3 memory cells in PL10 because an enhanced program bias step up is going to be applied in PL11 to provide a large increase in their Vth. At this time in the programming, it is known that the INT3 memory cells have not reached their verify level so that a verify test can be omitted. Further, the first verify test for INT3 can be delayed until the program loop (PL11) which is directly after (e.g., the next PL) the program loop (PL10) in which a determination is made that the memory cells assigned to the target intermediate state INT2 have completed programming. Generally, the first verify test for INT3 can be delayed until a number N>1 of program loops after the program loop (PL10) in which a determination is made that the memory cells assigned to the target intermediate state INT2 have completed programming.

In one approach, the first verify test for INT3 in the first program pass can be performed at a predetermined loop number, e.g., PL12. If the INT2 memory cells complete programming at P10, the first verify test for INT3 is moved up to PL11. However, if the INT2 memory cells do not complete programming until P13, for example, the first verify test for INT3 can still be performed at P12. In this case, the first verify test for INT3 is set by the predetermined loop number rather than being triggered by the program completion for INT2. In one approach, the first verify test for INT3 in the first program pass can be in the earlier of the predetermined loop number and the PL which is a function of the program completion for INT2.

PL11 is an example of a single program loop in which the program bias of the INT3 memory cells is stepped up by the enhanced amount.

FIG. 14B depicts a plot of bit line voltage versus program loop number consistent with FIG. 14A. In FIGS. 14B, 15B, 16B, 17B and 18B, the bit lines voltages are depicted for the memory cells assigned to the INT1, INT2 and INT3 states by a solid line, a dotted line and a solid line with circle ends, respectively. Vbl can be at 0 V, a nominal bit line voltage, to provide a nominal program bias step in a program loop. Vbl can be at Vbl_inh to inhibit programming. Vbl can be at Vbl_slow for a memory cell in a slow program mode. Vbl_en depicts a negative bit line voltage which is not used in this example. For INT1-INT3, Vbl=0 V or Vbl_slow until the cells pass their verify test, after which Vbl=Vbl_inh. As mentioned, the determination of whether a state has completed programming is based on to the bit scan result. Vbl can be different in a given program loop for different cells assigned to a common state since some cells are faster than others. Therefore, for the same program loop, the fast cells of the state may receive Vbl_inh, the moderately fast cells of the state may receive Vbl_slow and the slow cells of the state may receive Vbl=0 V.

FIG. 15A depicts a plot 1500 of a selected word line voltage versus program loop number in a first pass of a program operation, consistent with FIG. 13, where a program bias is stepped up by an enhanced amount by stepping up a program voltage by a larger than nominal amount and by applying a negative bit line voltage. A respective program pulse P1-P14 is applied in each program loop. P2-P10 step up by a nominal step size dVpgm. P11 steps up by a larger than nominal amount, dVpgml, in response to the determination in PL10 that the memory cells assigned to INT2 complete programming. PL11 is in the program loop which directly follows PL10. A first verify test for INT3 is also performed in PL11. P12-P14 step up by the nominal step size dVpgm.

One or more verify voltages are applied after the program pulse in every program loop except PL10. For example, VINT1 is applied in PL1 (plot 1501) and PL2. VINT1L, VINT1, VINT2L and VINT2 are applied in PL3 (plot 1502), PL4 and PL5. VINT2L and VINT2 are applied in PL6 (plot 1503) and PL7-PL9. VINT3 (plot 1504) is applied in PL11 and PL12-PL14.

A determination is made in PL6 and PL10 that the memory cells assigned to INT1 and INT2, respectively, have completed programming. The memory cells assigned to INT3 complete programming in PL14.

Also in this example, and consistent with Vbl_en in FIG. 15B, the negative drain voltage is applied to the memory cells assigned to the higher intermediate state during the additional program pulses P11-P14 until the memory cells assigned to the higher intermediate state complete programming.

Consistent with Vbl_en in FIG. 15B, the negative drain voltage applied to the memory cells assigned to the higher intermediate state during the additional program pulses is fixed.

Also in this example, the initial program pulses have a fixed step size (dVpgm), and a first program pulse (P11) of the additional program pulses has an enhanced step size (dVPgml) which is greater than the fixed step size.

Remaining program pulses (P12-P14) of the additional program pulses have the fixed step size (dVpgm).

PL11 is an example of a single program loop in which the program bias of the INT3 memory cells is stepped up by the enhanced amount.

FIG. 15B depicts a plot of bit line voltage versus program loop number consistent with FIG. 15A. For INT1-INT3, Vbl=0 V or Vbl_slow until the cells pass their verify test, after which Vbl=Vbl_inh. For INT3, Vbl=0 V until PL11, when Vbl=Vbl_en, e.g., −0.5 to −3 V. When Vbl_en is applied during P11 instead of Vbl=0 V, an enhanced program bias is applied. That is, with a negative Vbl, the drain voltage is lower so that the gate-to-drain voltage of a memory cell is higher than when the drain is at 0 V. This enhancement is in addition to the enhancement provided by the larger than nominal step up of P11.

P1-P10 are examples of initial program pulses. The bit line voltage is the same as the drain voltage of the memory cells. Accordingly, 0 V is an example of a nominal drain voltage for the memory cells assigned to the higher intermediate state, e.g., INT3, during the initial program pulses. In response to the milestone being reached where the INT2 memory cells complete programming, an example method includes applying additional program pulses P11-P14 to the word line to program the memory cells assigned to the higher intermediate state. A negative drain voltage, Vbl_en, lower than the nominal drain voltage, is applied to the memory cells assigned to the higher intermediate state during P11. Vbl_en, Vbl_slow or Vbl_inh are applied during P12-P14.

FIG. 16A depicts a plot 1600 of a selected word line voltage versus program loop number in a first pass of a program operation, consistent with FIG. 13, where a program bias is stepped up in PL10 by an enhanced amount by applying a negative bit line voltage, based on a determination made in PL9 that programming of the memory cells assigned to INT2 is completed. A respective program pulse P1-P14 is applied in each program loop. P2-P14 step up by the nominal step size dVpgm. A first verify test for INT3 is performed in PL10 based on the determination in PL9 that the memory cells assigned to INT2 complete programming. This example differs from prior examples in that the determination of whether programming is completed for a data state is made in the same program loop in which the programming is completed.

One or more verify voltages are applied after the program pulse in every program loop except PL10. For example, VINT1 is applied in PL1 (plot 1601) and PL2. VINT1L, VINT1, VINT2L and VINT2 are applied in PL3 (plot 1602), PL4 and PL5. VINT2L and VINT2 are applied in PL6 (plot 1603) and PL7-PL10. VINT3L and VINT3 are applied in PL10 (plot 1604) and PL11-PL14.

A determination is made in PL5 and PL9 that the memory cells assigned to INT1 and INT2, respectively, have completed programming. The memory cells assigned to INT3 complete programming in PL14.

PL10 is an example of a single program loop in which the program bias of the INT3 memory cells is stepped up by the enhanced amount.

FIG. 16B depicts a plot of bit line voltage versus program loop number consistent with FIG. 16A. For INT1-INT3, Vbl=0 V or Vbl_slow until the cells pass their verify test, after which Vbl=Vbl_inh. For INT3, Vbl=0 V until PL10, when Vbl=Vbl_en. When Vbl_en is applied during P10 instead of Vbl=0 V, an enhanced program bias is applied. This is the sole enhancement since the program voltage, e.g., P10, is not stepped up by a larger than nominal amount. Vbl_en, Vbl_slow or Vbl_inh are applied during P11-P14.

FIG. 17A depicts a plot 1700 of a selected word line voltage versus program loop number in a first pass of a program operation, consistent with FIG. 13, where a program bias is stepped up by an enhanced amount in PL11 by applying a negative bit line voltage, based on a determination made in PL10 that programming of the memory cells assigned to INT2 is completed. A respective program pulse P1-P14 is applied in each program loop. P2-P14 step up by the nominal step size dVpgm. A first verify test for INT3 is performed in PL11 based on the determination in PL10 that the memory cells assigned to INT2 complete programming. This example differs from FIG. 16A where the determination of whether programming is completed for INT2 is made in PL9.

One or more verify voltages are applied after the program pulse in every program loop except PL10. For example, VINT1 is applied in PL1 (plot 1701) and PL2. VINT1L, VINT1, VINT2L and VINT2 are applied in PL3 (plot 1702), PL4 and PL5. VINT2L and VINT2 are applied in PL6 (plot 1703) and PL7-PL9. VINT3L and VINT3 are applied in PL11 (plot 1704) and PL12-PL14.

A determination is made in PL6 and PL10 that the memory cells assigned to INT1 and INT2, respectively, have completed programming. The memory cells assigned to INT3 complete programming in PL14.

PL11 is an example of a single program loop in which the program bias of the INT3 memory cells is stepped up by the enhanced amount.

FIG. 17B depicts a plot of bit line voltage versus program loop number consistent with FIG. 17A. For INT1-INT3, Vbl=0 V or Vbl_slow until the cells pass their verify test, after which Vbl=Vbl_inh. For INT3, Vbl=0 V until PL11, when Vbl=Vbl_en. When Vbl_en is applied during P11 instead of Vbl=0 V, an enhanced program bias is applied. This is the sole enhancement since the program voltage, e.g., P11, is not stepped up by a larger than nominal amount. Vbl_en, Vbl_slow or Vbl_inh are applied during P12-P14.

Figure 17C:
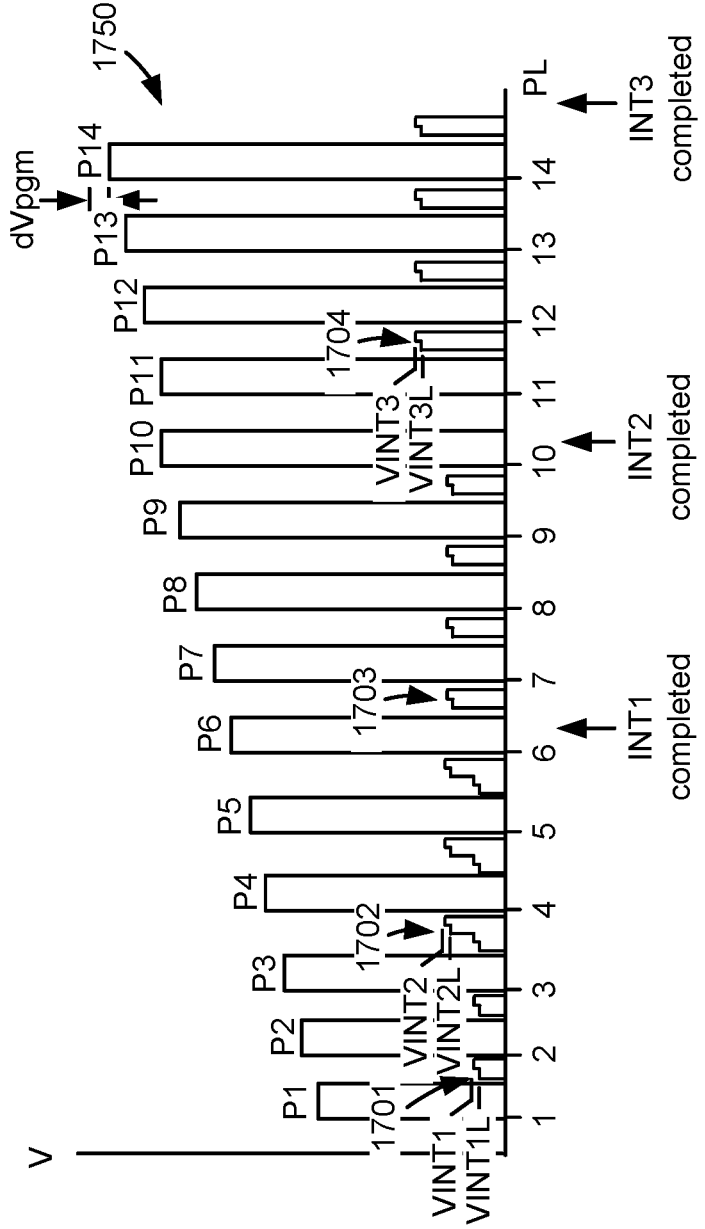
FIG. 17C depicts a plot 1750 of a selected word line voltage versus program loop number in a first pass of a program operation, similar to FIG. 17A except the program pulse magnitude is not stepped up in PL11.

FIG. 17C depicts a plot 1750 of a selected word line voltage versus program loop number in a first pass of a program operation, similar to FIG. 17A except the program pulse magnitude is not stepped up in PL11. The program pulse magnitude is not stepped up in the same program loop, PL11, in which the program bias is stepped up by an enhanced amount. The bit line voltages can be the same as in FIG. 17B.

The program bias step up relative to PL10 is provided entirely by the negative bit line voltage, Vbl_en. For example, the program bias in PL10 is P10–0 V, the gate to drain voltage. The program bias in PL11 is P11(=P10)–Vbl_en. The step up in the program bias from PL10 to PL11 is thus |Vbl_en|. This approach can reduce the maximum program pulse magnitude which is needed in the first program pass and avoid an excessive increase in Vth for the INT3 memory cells.

In this approach, a control circuit is configured to not step up a program pulse in a program loop in which the negative bit line voltage is set.

Figure 18A:
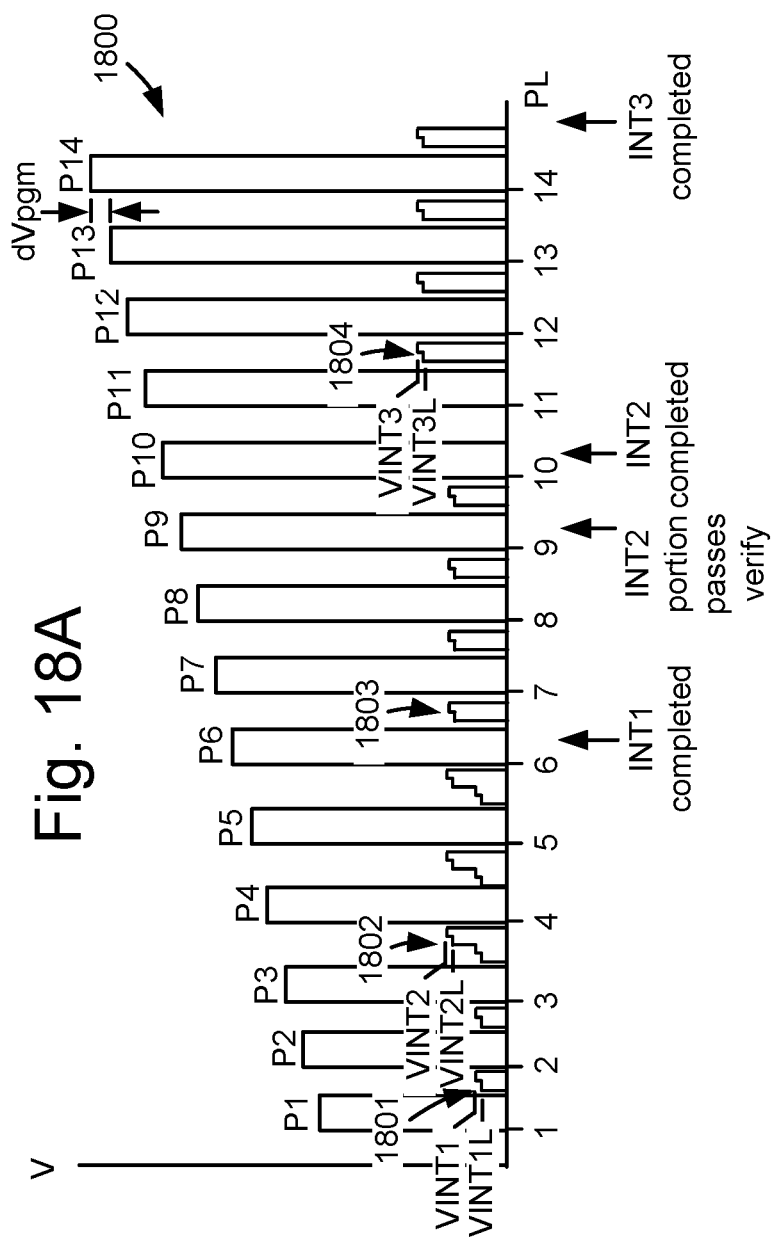
FIG. 18A depicts a plot of a selected word line voltage versus program loop number in a first pass of a program operation, consistent with FIG. 13, where a program bias is stepped up in PL10 by an enhanced amount by applying a negative bit line voltage, based on a determination made in PL9 that a portion of the memory cells assigned to INT2 have passed a verify test.

FIG. 18A depicts a plot 1800 of a selected word line voltage versus program loop number in a first pass of a program operation, consistent with FIG. 13, where a program bias is stepped up by an enhanced amount in PL10 by applying a negative bit line voltage, based on a determination made in PL9 that a portion of the memory cells assigned to INT2 have passed a verify test. A respective program pulse P1-P14 is applied in each program loop. P2-P14 step up by the nominal step size dVpgm. A first verify test for INT3 is performed in PL11 based on the determination in PL10 that the memory cells assigned to INT2 complete programming. Additionally, the enhanced program bias step up is provided in PL10 based on a determination in PL9 that at least a specified number of memory cells assigned to INT2 have passed their verify test, even when programming is not yet completed for the INT2 memory cells.

One or more verify voltages are applied after the program pulse in every program loop except PL10. For example, VINT1 is applied in PL1 (plot 1801) and PL2. VINT1L, VINT1, VINT2L and VINT2 are applied in PL3 (plot 1802), PL4 and PL5. VINT2L and VINT2 are applied in PL6 (plot 1803) and PL7-PL9. VINT3L and VINT3 are applied in PL11 (plot 1804) and PL12-PL14.

A determination is made in PL6 and PL10 that the memory cells assigned to INT1 and INT2, respectively, have completed programming. The memory cells assigned to INT3 complete programming in PL14.

PL10 is an example of a single program loop in which the program bias of the INT3 memory cells is stepped up by the enhanced amount.

Figure 18B:
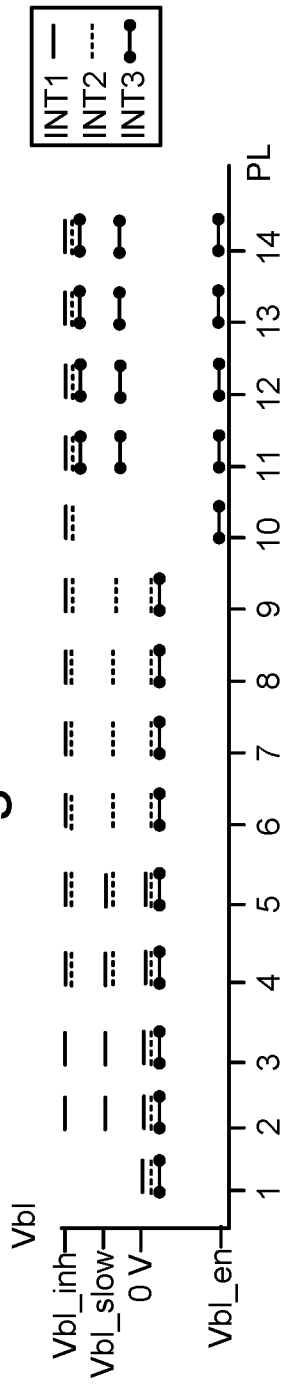
FIG. 18B depicts a plot of bit line voltage versus program loop number consistent with FIG. 18A.

FIG. 18B depicts a plot of bit line voltage versus program loop number consistent with FIG. 18A. For INT1-INT3, Vbl=0 V or Vbl_slow until the cells pass their verify test, after which Vbl=Vbl_inh. For INT3, Vbl=0 V until PL10, when Vbl=Vbl_en. When Vbl_en is applied during P10 instead of Vbl=0 V, an enhanced program bias is applied. This is the sole enhancement since the program voltage, e.g., P10, is not stepped up by a larger than nominal amount. Vbl_en, Vbl_slow or Vbl_inh are applied during P11-P14.

FIG. 19 depicts example plots for various voltage signals in a program loop of a first program pass consistent with FIG. 13-18B. The program loop includes a pre-charge phase at t0-t1. A program pulse is applied at t2-t3. A recovery phase is at t3-t5. A Vread spike is applied before and after the verify test, at t5-t6 and t8-t9, respectively. This is a channel clean voltage which equalizes the channel potential. A verify test is performed at t7-t8. In this example, a verify voltage VINT2 is applied.

A plot 1900 depicts VWL_sel, a voltage of a selected word line in the program operation. A plot 1910 depicts VWL_unsel, a voltage of unselected word lines. A plot 1920 depicts Vsgd_sel, the voltage for SGD transistors of a selected sub-block. A plot 1930 depicts Vsgd_unsel, the voltage for SGD transistors of an unselected sub-block, and Vsgs. A plot 1940 depicts Vbl_unsel, the voltage for bit lines connected to unselected NAND strings. A plot 1950 depicts Vbl_sel, the voltage for bit lines connected to selected NAND strings. A plot 1960 depicts Vsl, the source line voltage.

During the pre-charge, Vsgd_sel is elevated and Vbl_sel=0 V to provide the SGD transistor in a conductive state. Vsgd_sel is then returned to a lower level during the program pulse so that the SGD_sel transistor will be on or off if Vbl is low or high, respectively. With Vbl_unsel high, e.g., 1.5 V, the SGD transistors of the unselected NAND strings will be in a non-conductive state to inhibit programming.

For the selected NAND strings, Vbl_sel can be 0 V for normal speed programming, 0.7 V for slow speed programming or −1 V for an enhanced program bias, for example. Vbl can be in a negative range of −0.5 to −3 V, for example. A negative voltage can be provided on the memory chip using a triple well technology. The negative bit line voltage can be supplied by the column decoder. These bit line voltages are low enough to provide the corresponding SGD transistors in a conductive state.

Vsgd_unsel and Vsgs are elevated during the pre-charge, to provide the SGD and SGS transistors in a conductive state, and then returned to 0 V during the program pulse.

During the verify test, Vsgd_sel and Vsgs are set to Vread to provide the corresponding transistors in a conductive state to allow sensing to occur. Vsgd_unsel is spiked up to Vread at t5-t6 and then kept at 0 V while Vbl_unsel is set at a small positive voltage to provide the corresponding SGD transistors in a non-conductive state, to avoid interfering with the sensing of the selected NAND strings. The spiking of Vsgd_unsel to Vread helps drain out residue electrons from the channels of the unselected NAND strings in the unselected sub-blocks.

Vbl_sel is elevated to Vsense to allow sensing to occur.

Vsl can be elevated during the pre-charge, the program pulse and the verify test.

Example time periods are depicted in which a state bit scan, FF fill and PCHSEL occur.

To identify the memory cells subject to a verify test, a scanning operation is performed for latches associated with each NAND string. This is referred to as a pre-charge select (PCHSEL) scan operation and is used to determine which bit lines to set to a sense voltage in the verify test. The pre-charge (PCH) refers to increase the bit line voltage to the sense voltage. The select (SEL) refers to selected bit lines. These latches can include the sense node latch 172 and data state latches 194-197 (FIG. 2). The sense node latch can be set in the prior program loop based on a pass/fail result of a verify test in the prior program loop, for each memory cell subject to the verify test. It is also possible to set the sense node latch in the current program loop for a few memory cells which failed the verify test in the prior program loop. For example, assume 99.5% of the INT2 state memory cells pass a verify test in the prior program loop and 0.5% fail and that the threshold for completing programming is 99% of the INT2 state memory cells. The memory cells which pass will have their latches updated in the prior program loop to indicate the pass status. Moreover, the INT2 state memory cells which fail the verify test in the prior program loop will have their latches updated in the current program loop to also indicate the pass status, since the data state is considered to have completed programming. An operation referred to as an FF fill operation is used to set a pass status in the latches of these failed memory cells. FF is the hexadecimal value for a string of eight binary 1's and denotes setting sense node latches to a 1 value to indicate a program inhibit status.

An operation referred to as a state bit scan can be performed in the current program loop to count the number of memory cells of a given data state which have a fail status. If the count is below a threshold, such as 1% of the memory cells of the given data state, the data state is considered to have completed programming and the FF fill operation is initiated. If the count is not below the threshold, the data state is not considered to have completed programming and the FF fill operation is omitted in the current program loop.

The state bit scan can be used to determine whether programming has been completed for a state, or whether a specified portion of the memory cells for a data state have passed their verify test.

Other operations also involve reading (scanning) and setting the latches. For example, a lockout scan is performed at the end of a given program loop to determine whether to set a bit line voltage to an inhibit or program level in a next program loop.

The voltage signals of FIG. 19 can also be used in a program loop in a second program pass. The enhanced program bias step up may be omitted, such that Vbl_en is not used, in one approach.

FIG. 20 depicts a plot 2000 of a selected word line voltage versus program loop number in a second pass of a program operation, consistent with FIG. 13. In this example, the voltage signal includes 25 program-verify loops, PL1-PL25. Each loop includes a program pulse and verify voltages. For example, a program pulse plot 2001 and verify voltages (plot 2002) are provided in PL1. The verify voltages are depicted in a simplified form and can be provided for progressively higher data states as the programming proceeds. As in FIG. 14A-18B, the peak magnitudes of the program pulses may increase in consecutive program loops as depicted, in a technique referred to as incremental step pulse programming.

Accordingly, it can be seen that in one implementation, an apparatus comprises: a control circuit configured to connect to a plurality of memory cells. The control circuit, to perform a program operation for the plurality of memory cells, is configured to: perform a first program pass in which the plurality of memory cells are programmed to a plurality of intermediate states in successive program loops, the plurality of memory cells comprise memory cells configured to be programmed to a target intermediate state of the plurality of intermediate states and memory cells configured to be programmed to a higher intermediate state, higher than the target intermediate state, of the plurality of intermediate states, the memory cells configured to be programmed to the target intermediate state receive a program bias which is stepped up in the successive program loops until the memory cells assigned to the target intermediate state reach a milestone, the memory cells configured to be programmed to the higher intermediate state receive a program bias which is stepped up in the successive program loops by a nominal amount until the milestone is reached; in the first program pass, in response to the milestone being reached, step up a program bias for the memory cells assigned to the higher intermediate state by an enhanced amount, greater than the nominal amount; and perform a second program pass in which the plurality of memory cells are programmed from the plurality of intermediate states to a plurality of final states.

In another implementation, a method comprises: programming a plurality of memory cells to a plurality of intermediate states in successive program loops, the plurality of memory cells comprise memory cells configured to be programmed to a target intermediate state of the plurality of intermediate states and memory cells configured to be programmed to a higher intermediate state, higher than the target intermediate state, of the plurality of intermediate states, the programming comprises applying a program bias to the memory cells configured to be programmed to the target intermediate state which is stepped up in the successive program loops and applying a program bias to the memory cells configured to be programmed to the higher intermediate state which is stepped up in the successive program loops by a nominal amount, until programming is completed for the memory cells assigned to the target intermediate state; in response to the programming being completed for the memory cells assigned to the target intermediate state, stepping up the program bias for the memory cells assigned to the higher intermediate state by an enhanced amount, greater than the nominal amount; and programming the plurality of memory cells from the plurality of intermediate states to a plurality of final states.

In another implementation, an apparatus comprises: a control circuit configured to connect to a plurality of memory cells, the plurality of memory cells are connected to a word line and comprise memory cells assigned to a target intermediate state and memory cells assigned to a higher intermediate state; and a memory interface connected to the control circuit. The control circuit is configured to issue a command via the memory interface to: apply initial program pulses to the word line until the memory cells assigned to the target intermediate state reach a milestone; apply a nominal drain voltage to the memory cells assigned to the higher intermediate state during the initial program pulses; in response to the milestone being reached, apply additional program pulses to the word line to program the memory cells assigned to the higher intermediate state; and apply a negative drain voltage, lower than the nominal drain voltage, to the memory cells assigned to the higher intermediate state during the additional program pulses.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of memory cells, the control circuit, to perform a program operation for the plurality of memory cells, is configured to:
perform a first program pass in which the plurality of memory cells are programmed to a plurality of intermediate states in successive program loops, the plurality of memory cells comprise memory cells configured to be programmed to a target intermediate state of the plurality of intermediate states and memory cells configured to be programmed to a higher intermediate state, higher than the target intermediate state, of the plurality of intermediate states, the memory cells configured to be programmed to the target intermediate state receive a program bias which is stepped up in the successive program loops until the memory cells assigned to the target intermediate state reach a milestone, the memory cells configured to be programmed to the higher intermediate state receive a program bias which is stepped up in the successive program loops by a nominal amount until the milestone is reached;
in the first program pass, in response to the milestone being reached, step up a program bias for the memory cells assigned to the higher intermediate state by an enhanced amount, greater than the nominal amount; and
perform a second program pass in which the plurality of memory cells are programmed from the plurality of intermediate states to a plurality of final states.

2. The apparatus of claim 1, wherein:
the step up of the program bias by the enhanced amount is in a single program loop which is next after a program loop in which a determination is made that the milestone is reached.

3. The apparatus of claim 1, wherein the control circuit is configured to:
delay a first verify test for the memory cells assigned to the higher intermediate state in the first program pass until a program loop which is next after a program loop in which the control circuit determines that the milestone is reached; and
step up the program bias by the enhanced amount in the program loop which is next after the program loop in which the control circuit determines that the milestone is reached.

4. The apparatus of claim 1, wherein:
the higher intermediate state is a highest intermediate state of the plurality of intermediate states; and
the target intermediate state is a second highest intermediate state of the plurality of intermediate states.

5. The apparatus of claim 1, wherein:
the control circuit is configured to set the enhanced amount as a function of a spacing between a verify voltage of the target intermediate state and a verify voltage of the higher intermediate state.

6. The apparatus of claim 1, wherein:
the plurality of memory cells are in respective NAND strings connected to respective bit lines;
the control circuit is configured to set a nominal bit line voltage for the memory cells assigned to the higher intermediate state when program pulses are applied to the plurality of memory cells until the milestone is reached; and to step up the program bias by the enhanced amount, the control circuit is configured to set a negative bit line voltage, lower than the nominal bit line voltage, for the memory cells assigned to the higher intermediate state when a program pulse is applied to the plurality of memory cells after the milestone is reached.

7. The apparatus of claim 6, wherein:
the control circuit is configured to not step up a program pulse in a program loop in which the negative bit line voltage is set.

8. The apparatus of claim 6, wherein:
the nominal bit line voltage is a ground voltage.

9. The apparatus of claim 1, wherein:
the milestone is reached when programming is completed for the memory cells assigned to the target intermediate state.

10. The apparatus of claim 1, wherein:
the milestone is reached when at least a specified number of the memory cells assigned to the target intermediate state pass a verify test.

11. The apparatus of claim 1, wherein:
the control circuit is configured to apply program pulses with a nominal voltage step to the plurality of memory cells until the milestone is reached;
to step up the program bias by the enhanced amount, the control circuit is configured to apply a program pulse with a larger than the nominal voltage step to the plurality of memory cells after the milestone is reached; and
the control circuit is configured to apply program pulses with the nominal voltage step to the plurality of memory cells after the applying of the program pulse with the larger than the nominal voltage step.

12. A method, comprising:
programming a plurality of memory cells to a plurality of intermediate states in successive program loops, the plurality of memory cells comprise memory cells configured to be programmed to a target intermediate state of the plurality of intermediate states and memory cells configured to be programmed to a higher intermediate state, higher than the target intermediate state, of the plurality of intermediate states, the programming comprises applying a program bias to the memory cells configured to be programmed to the target intermediate state which is stepped up in the successive program loops and applying a program bias to the memory cells configured to be programmed to the higher intermediate state which is stepped up in the successive program loops by a nominal amount, until programming is completed for the memory cells assigned to the target intermediate state;
in response to the programming being completed for the memory cells assigned to the target intermediate state, stepping up the program bias for the memory cells assigned to the higher intermediate state by an enhanced amount, greater than the nominal amount; and
programming the plurality of memory cells from the plurality of intermediate states to a plurality of final states.

13. The method of claim 12, wherein the stepping up of the program bias by the enhanced amount is in a single program loop which is next after a program loop in which a determination is made that the memory cells assigned to the target intermediate state complete programming, the method further comprising:
stepping up the program bias for the memory cells assigned to the higher intermediate state by a nominal amount which is less than the enhanced amount in successive program loops which are after the single program loop.

14. The method of claim 12, wherein the plurality of memory cells are in respective NAND strings connected to respective bit lines, the method further comprising:
setting a nominal bit line voltage for the memory cells assigned to the higher intermediate state when program pulses are applied to the plurality of memory cells until the memory cells assigned to the target intermediate state complete programming;
wherein the stepping up of the program bias by the enhanced amount comprises setting a negative bit line voltage, lower than the nominal bit line voltage, for the memory cells assigned to the higher intermediate state when a program pulse is applied to the plurality of memory cells.

15. The method of claim 12, further comprising:
identifying a program loop in which a determination is made that the memory cells assigned to the target intermediate state have completed programming; and
delaying a first verify test for the memory cells assigned to the higher intermediate state until a program loop which is after the identified program loop, wherein a verify test is not performed for any of the plurality of memory cells in the identified program loop.

16. An apparatus, comprising:
a control circuit configured to connect to a plurality of memory cells, the plurality of memory cells are connected to a word line and comprise memory cells assigned to a target intermediate state and memory cells assigned to a higher intermediate state; and
a memory interface connected to the control circuit, the control circuit is configured to issue a command via the memory interface to:
apply initial program pulses to the word line until the memory cells assigned to the target intermediate state reach a milestone;
apply a nominal drain voltage to the memory cells assigned to the higher intermediate state during the initial program pulses;
in response to the milestone being reached, apply additional program pulses to the word line to program the memory cells assigned to the higher intermediate state; and
apply a negative drain voltage, lower than the nominal drain voltage, to the memory cells assigned to the higher intermediate state during the additional program pulses.

17. The apparatus of claim 16, wherein:
the negative drain voltage is applied to the memory cells assigned to the higher intermediate state during the additional program pulses until the memory cells assigned to the higher intermediate state complete programming.

18. The apparatus of claim 16, wherein:
the negative drain voltage applied to the memory cells assigned to the higher intermediate state during the additional program pulses is fixed.

19. The apparatus of claim 16, wherein:
the initial program pulses have a fixed step size; and a first program pulse of the additional program pulses has an enhanced step size which is greater than the fixed step size.

20. The apparatus of claim 19, wherein:

remaining program pulses of the additional program pulses have the fixed step size.

* * * * *